US012219706B2

(12) United States Patent
Thibado et al.

(10) Patent No.: US 12,219,706 B2
(45) Date of Patent: Feb. 4, 2025

(54) REMOVABLE AND LOW INSERTION FORCE CONNECTOR SYSTEM

(71) Applicant: Intel Corporation, Santa Clara, CA (US)

(72) Inventors: Jonathan W. Thibado, Beaverton, OR (US); Aaron Gorius, Upton, MA (US); Michael T. Crocker, Portland, OR (US); Matthew J. Adiletta, Bolton, MA (US); John C. Gulick, Portland, OR (US); Emery E. Frey, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 587 days.

(21) Appl. No.: 17/354,989

(22) Filed: Jun. 22, 2021

(65) Prior Publication Data

US 2021/0400813 A1  Dec. 23, 2021

Related U.S. Application Data

(63) Continuation-in-part of application No. 17/337,342, filed on Jun. 2, 2021, now Pat. No. 12,082,370.

(Continued)

(51) Int. Cl.
*H05K 1/00* (2006.01)
*H05K 1/03* (2006.01)
(Continued)

(52) U.S. Cl.
CPC .......... *H05K 1/118* (2013.01); *H05K 1/0393* (2013.01); *H05K 3/284* (2013.01); *H05K 3/366* (2013.01); *H05K 7/02* (2013.01); *H05K 7/20236* (2013.01)

(58) Field of Classification Search
CPC ...... H05K 1/118; H05K 1/0393; H05K 3/284; H05K 3/366; H05K 7/02; H05K 7/20236
(Continued)

(56) References Cited

U.S. PATENT DOCUMENTS 5,167,511 A * 12/1992 Krajewski .............. H01R 12/71
439/260
5,963,793 A * 10/1999 Rinne .................. H01L 25/0657
257/E23.021

(Continued)

FOREIGN PATENT DOCUMENTS

EP        1971193 A1 *  9/2008  ......... H01F 27/2804

OTHER PUBLICATIONS

Amphenol FCi, "ExaMAC® Connector System", Product Specification, Form E-3701-Revision D, Oct. 2015, 15 pages.

(Continued)

*Primary Examiner* — Zhengfu J Feng
(74) *Attorney, Agent, or Firm* — Compass IP Law PC

(57) ABSTRACT

Examples described herein relate to an apparatus that includes a flexible conductor covered in an insulative material and at least one conductor region in contact with the flexible conductor. In some examples, melting of the at least one conductor region is to cause a conductive coupling of the flexible conductor with a second conductor and wherein the flexible conductor is adapted to conductively couple a first circuit board oriented orthogonal to a second circuit board. In some examples, the at least one conductor region comprises at least one solder ball of a grid array. In some examples, the at least one conductor region is re-solderable.

20 Claims, 37 Drawing Sheets

Related U.S. Application Data

(60) Provisional application No. 63/061,633, filed on Aug. 5, 2020, provisional application No. 63/034,314, filed on Jun. 3, 2020.

(51) Int. Cl.
  *H05K 1/11* (2006.01)
  *H05K 3/28* (2006.01)
  *H05K 3/36* (2006.01)
  *H05K 7/02* (2006.01)
  *H05K 7/20* (2006.01)

(58) Field of Classification Search
  USPC .......................................................... 361/749
  See application file for complete search history.

(56) References Cited

U.S. PATENT DOCUMENTS

| | | | |
|---|---|---|---|
| 6,768,640 B2 | 7/2004 | Doblar et al. | |
| 7,227,759 B2* | 6/2007 | Grundy | H05K 3/222 |
| | | | 361/785 |
| 7,863,091 B2 | 1/2011 | Coteus et al. | |
| 9,357,675 B2 | 5/2016 | Campbell et al. | |
| 2012/0212920 A1* | 8/2012 | Schreffler | H01R 12/737 |
| | | | 29/830 |
| 2013/0217260 A1* | 8/2013 | Nichols | H01R 13/6315 |
| | | | 439/493 |
| 2015/0261265 A1* | 9/2015 | Dean | G01R 31/2891 |
| | | | 361/679.46 |
| 2016/0351526 A1* | 12/2016 | Boyd | H01L 24/75 |
| 2019/0157253 A1* | 5/2019 | Browning | G11C 5/04 |
| 2020/0323100 A1* | 10/2020 | Chiu | H05K 7/208 |

OTHER PUBLICATIONS

Soupir, Pete, "High-Speed Orthogonal Connectors Optimize Signal Integrity", Molex, https://experience.molex.com/high-speed-orthogonal-connectors-optimize-signal-integrity/, Downloaded Jan. 18, 2023, 3 pages.

International Search Report and Written Opinion for PCT Patent Application No. PCT/US21/35776, Mailed Sep. 29, 2021, 12 pages.

Non-Published commonly owned U.S. Patent Application, Filed Jun. 2, 2021, 98 pages, Intel Corporation.

* cited by examiner

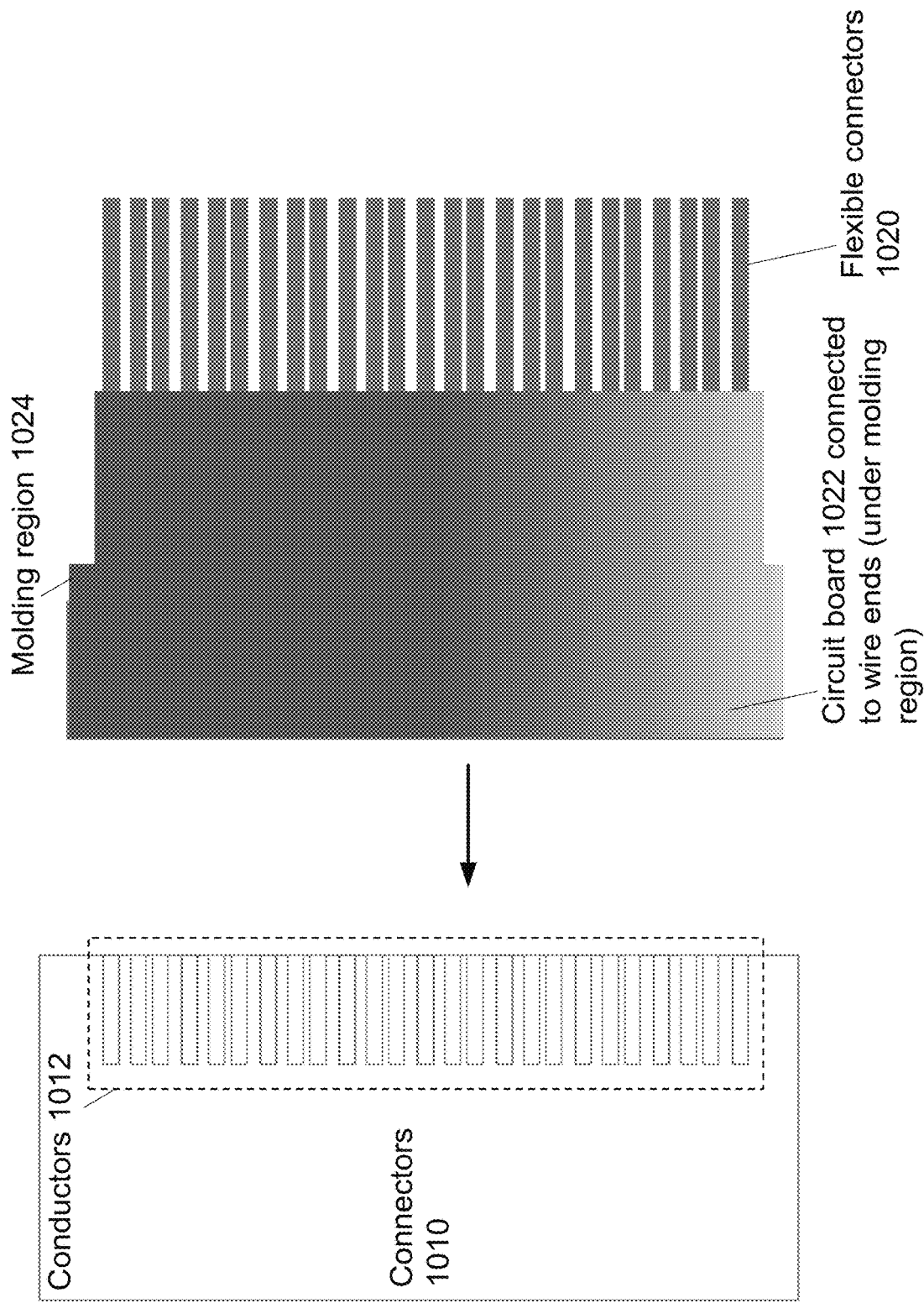

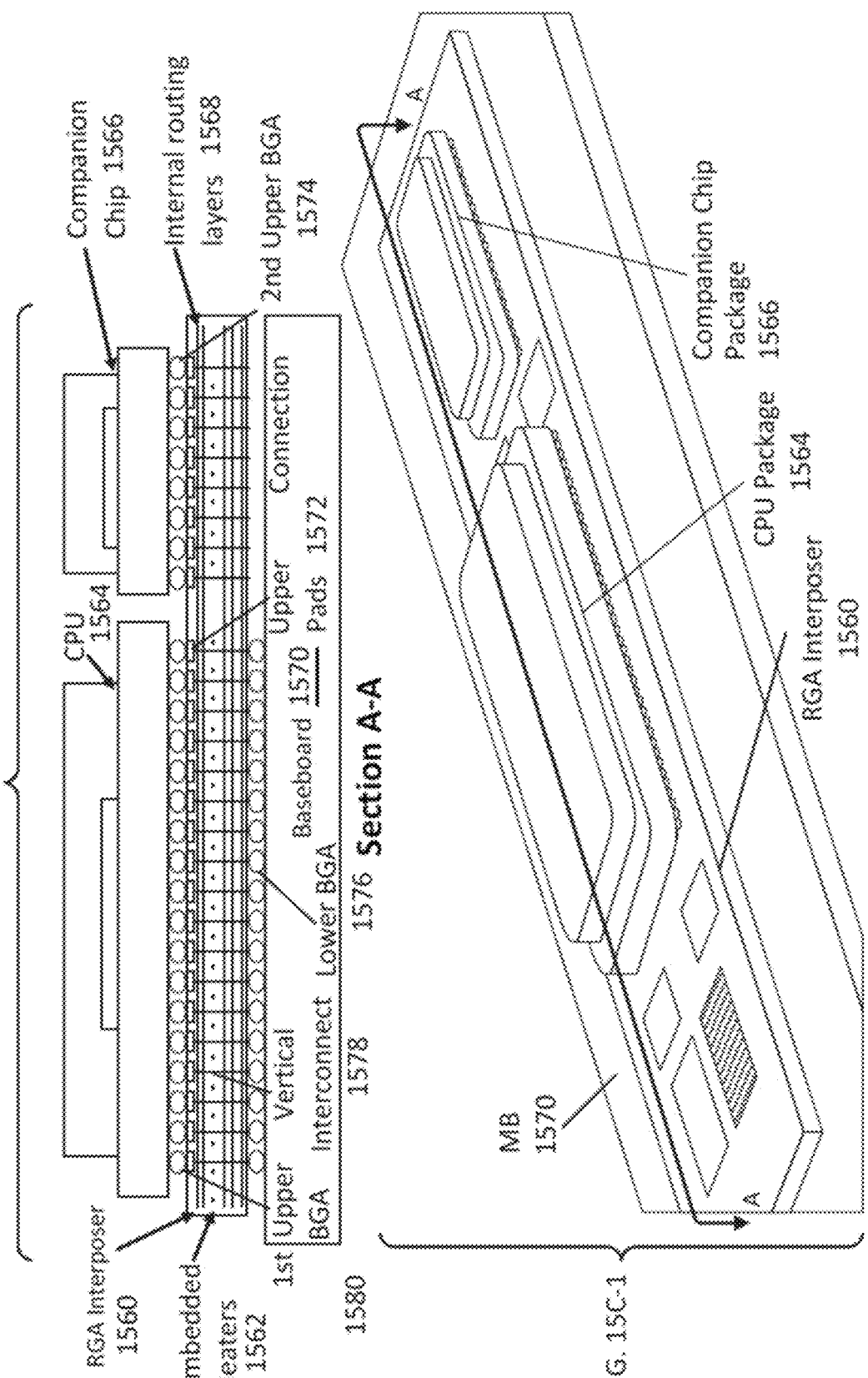

REMOVABLE AND LOW INSERTION FORCE CONNECTOR SYSTEM

RELATED APPLICATIONS

This application is a continuation-in-part of U.S. patent application Ser. No. 17/337,342, filed Jun. 2, 2021.

This application claims priority from U.S. Provisional Application No. 63/034,314, filed Jun. 3, 2020, and U.S. Provisional Application No. 63/061,633, filed Aug. 5, 2020.

The entire contents of those applications are incorporated by reference in their entirety.

BACKGROUND

Datacenters provide the backbone of cloud computing and the Internet. Some datacenters are designed to fit as much computing, memory, accelerator, and networking capability into a physically constrained space as possible but prevent device malfunction from overheating and also provide for ability to manipulate physical devices (e.g., insert or remove circuit boards or device dies) in space constrained environments and in a cost economical manner.

Fiber optic cables can be used in data centers to provide communicative coupling between clusters of devices. However, use of such cables can be expensive and also take space that could otherwise be used for devices or other uses. Copper traces on printed circuit boards (PCBs) are cheaper and dense but are limited in ability to transmit with acceptable signal to noise (SNR) ratio over longer distances.

Circuit boards can warp by insertion force during connection. Warping of circuit boards can cause distortion of signal quality transmitted through the board or to or from the board or can disturb operation of the circuits connected to the board. A circuit board-to-circuit board connector with gigabit per second (Gbps) or higher transfer rates is a molex class EXA connector. However, the EXA connector can be large and bulky, block airflow to devices that require cooling, and requires a very high insertion force that can damage circuit boards.

BRIEF DESCRIPTION OF THE DRAWINGS

FIG. 10D depicts an example of electrical conductors and a guide shield for use to connect a conductor end of a flexible conductor or connector to a corresponding connector on the motherboard.

FIGS. 15C-1 and 15C-2 depict an example manner of connecting first circuit board to a second circuit board.

DETAILED DESCRIPTION

Figure 1:
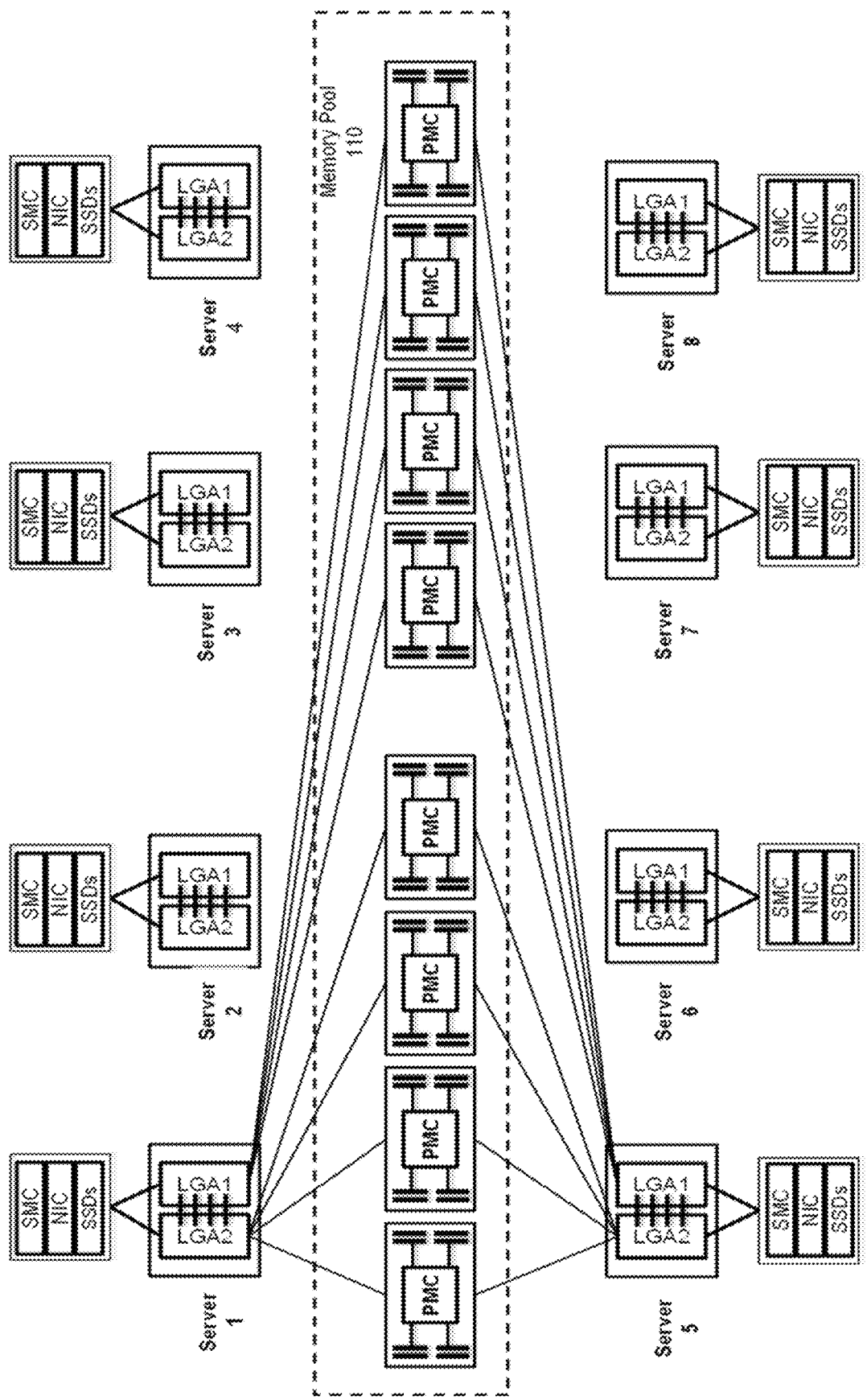
FIG. 1 depicts an example system.

A system includes a circuit board technology and circuit board-to-circuit board connection technology may or may not reduce cost of liquid cooling in warehouse scale computing and enable low latency memory pool sharing in a dense compute environment. The system can include an arrangement of circuit boards connected to other circuit boards using a flexible orthogonal connector. In some examples, circuit boards that are orthogonally connected can have edges oriented at any angle that is greater than 0 degrees and less than 180 degrees. A high density compute column could include variable numbers of compute sockets and employ multiple connection points to provide for compute, memory, accelerator, network attachment, network aggregation, and power delivery. The high density compute column can be submerged in a liquid cooling environment. For example, two phase immersion liquid cooling (2PILC) (or 2PIC) can be used such that a high density compute column (with potentially no heatsinks), is immersed into a liquid that has a low boiling point. These liquids can be organic compounds that are non-conductive and non-corrosive and that directly contact silicon devices. As the silicon or other material in a device or a device package emits heat, heat is transferred into the liquid around it, causing the liquid to boil. Because boiling turns the liquid into a gas, the gas rises, forcing convection of the liquid. The gas then condenses on a cold plate, water pipe or other condenser and falls back into the system as liquid for re-use.

An interposer can be attached to a motherboard and electrically connected to the motherboard. One or more processors can be conductively coupled to the interposer. Memory devices can be conductively coupled to the one or more processors via conductive connectors in or on the motherboard and conductively coupled to the interposer. Components in orthogonally connected boards can include a processor, accelerator, memory device, storage, and/or network interface.

Multiple orthogonal or inline connected boards can be connected with flexible orthogonal copper trace connectors that provide approximately 90 degree angle of connectivity between perpendicularly oriented circuit boards. Some examples of board interconnection can use ExaMAX® high speed connectors, backplane connector and so forth. In some examples, forward error correction (FEC) may not be needed if the signal traversal distance is short enough over copper traces, thus reducing latency of data availability.

A reduced thickness or height motherboard, interposer, or circuit board can be used so that a parallel stack of motherboards can interconnect within a short routing distance. Cables may not be used to connected motherboards, which can provide extra space for uses by other devices. Cables and their connectors can have a high failure rate and require high force manual attachment and can add considerable cost. Board connectorization can reduce failure rates and simplify data center assembly, and can significantly reduce cost. High central processing unit (CPU) core count, high frequency operation, high thermal design point (TDP), and access to a memory pool using Compute Express Link (CXL) or other standards can be supported. Examples can be used at least for executing microservices, services, applications, virtual machines (VMs), containers, providing infrastructure as a service (IaaS), providing high performance computing (HPC), databases, and other uses.

System Overview

FIG. 1 depicts an example system. In some examples, one or multiple servers can access (e.g., write or read) data in a memory pool 110. For example, one or more servers can include a pooled memory controller (PMC), System Management Controller or Secure Management Controller (SMC), solid state drive (SSD), and/or network interface card (NIC). A land grid array (LGA) can provide a physical interface for a microprocessor (e.g., CPU, XPU, graphics processing unit (GPU), accelerator, and so forth). Removeable Grid Array (RGA), interposer, and/or orthogonal connections can be used for board-to-board connections as described herein. Note that one or more elements from an example can be added to another example described herein.

Figure 2:
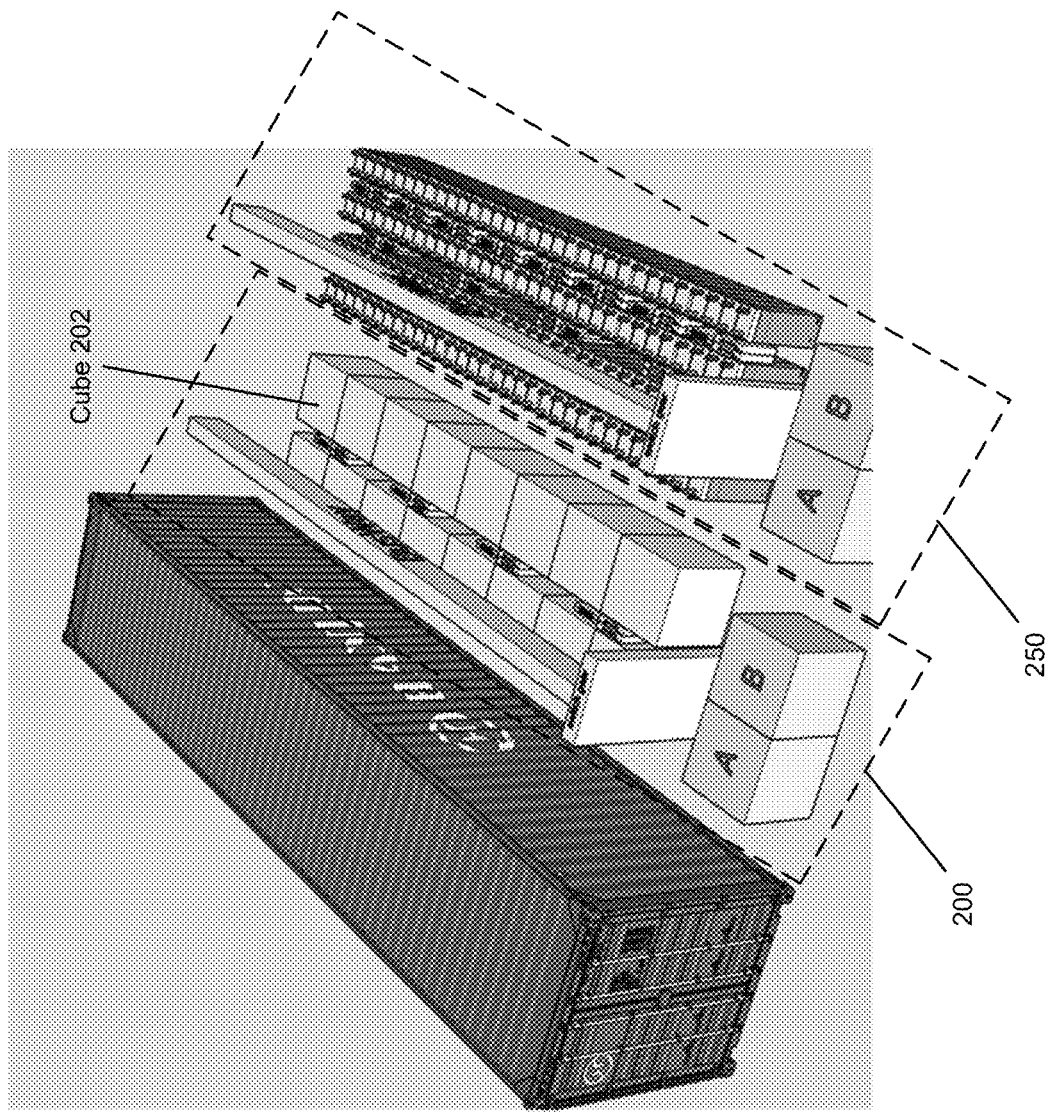
FIG. 2 shows an example of an arrangement of cubes with spine switches.

FIG. 2 shows an example of an arrangement of M cubes with N spine switches, where M and N are integers. A volume of a shipping crate is shown as a comparison to an arrangement of cubes, spine switches, power transformers, switch gear, and power distribution. Arrangement 200 includes multiple cubes, leaf network connections, power transformers A and B, switch gear, and power distribution. Cube 202 can include multiple encased compute columns (shown in 250), where at least one compute column includes a tank at least partially filled with liquid to immersion cool devices arranged therein. For example, a cube can include an integer X number of compute columns where a column includes an integer Y number of servers and an integer Z number of memory pools. Power transformers A and B can represent transformers that transfer electrical energy. Switch gear and bus way can provide for communications between compute columns and power delivery to compute columns. Arrangement 250 shows an exposed view of cubes of arrangement 200. A compute column can be encased in a tank and submerged in liquid to provide 2PILC of devices of the compute column.

Figure 3:
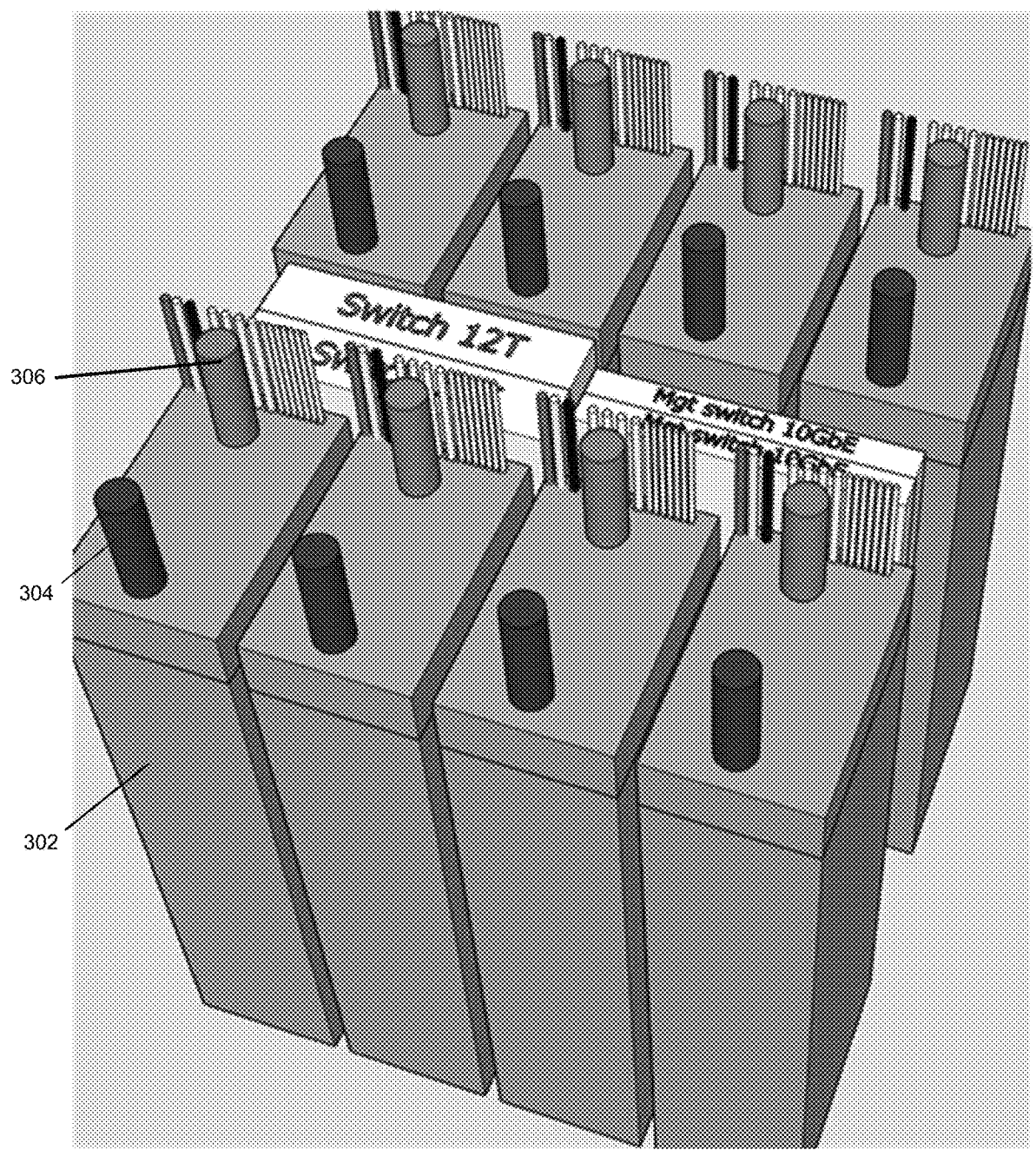
FIG. 3 depicts an example of an arrangement of compute columns.

FIG. 3 depicts an example of an arrangement of tanks with compute columns inside. Tank 302 can include one or multiple encased circuit boards with devices connected thereto. In some examples, tank 302 can contain liquid to cool devices arranged therein by immersion in liquid at least by 2PILC. As is described later, an orthogonal board arrangement can be used to reduce use of cables and provide liquid cooling for a single column per tank or multiple columns per tank. Cables 304 and/or 306 can provide liquid, network cabling, power supply, or other signals.

Figure 4:
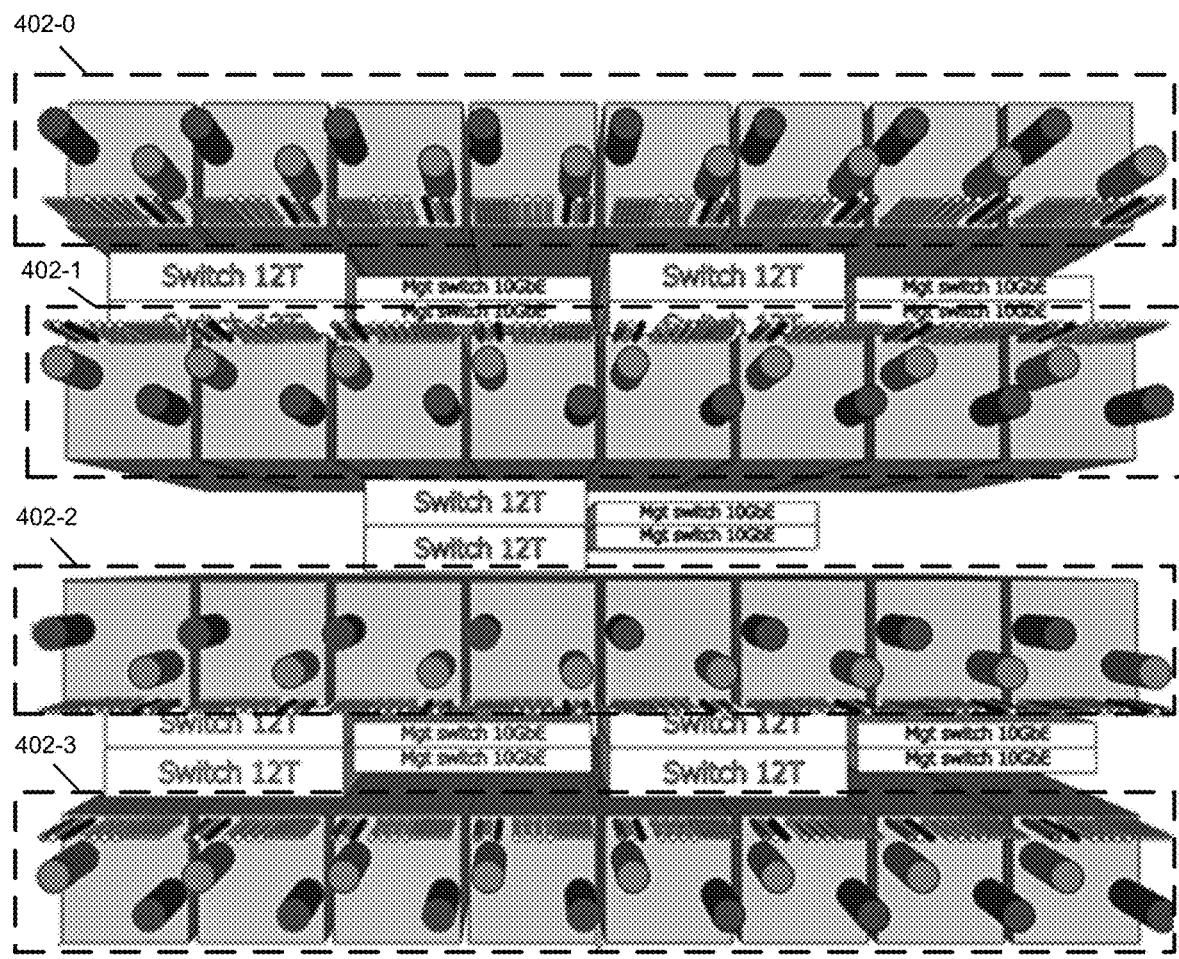
FIG. 4 depicts a top down view of deployable compute columns.

FIG. 4 depicts a top down view of deployable compute columns. Compute columns can be arranged in rows 402-0 to 402-3 as shown. Switches can be positioned between rows of compute columns and connect devices in compute columns to other devices in other compute columns in a same row or different row of compute columns.

Examples of Liquid Cooling of Devices

Figure 5:
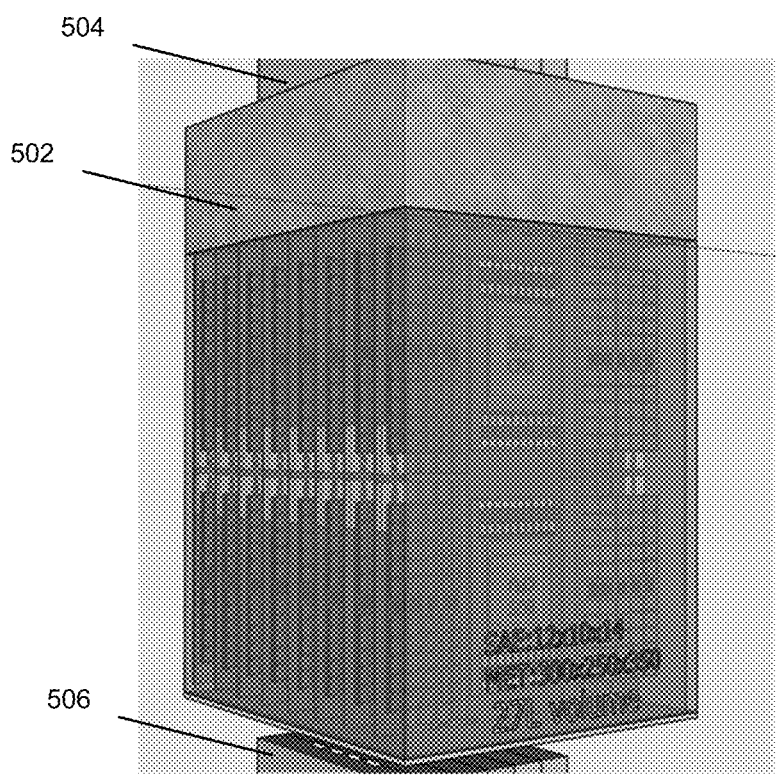
FIG. 5 shows an example of a compute column with circuitry submerged in liquid encased in a tank.

FIG. 5 shows an example of a compute column with circuitry submerged in liquid encased in a tank. For example, circuit boards and circuitry can be placed in tank 502 and tank 502 can retain liquid that is in contact with at least a portion of the circuit boards and circuitry within the compute column. In some examples, tank 502 can be at least partially formed of acrylic to allow for viewing of devices inside the tank. In some examples, tank 502 can be made at least partially of welded stainless steel material. Tank 502 can be any shape such as a rectangle, square, cylinder, and so forth. A cross section of tank 502 can be a square, rectangle, ellipse, or circle.

In some examples, motherboards are immersed within cooling liquid and encased in tank 502 and the motherboards are connected orthogonally to other boards as described herein. Electrical, optical, and/or millimeter waveguides can be used to provide communication between devices on the same or different boards. A liquid cooling material within the tank can be liquid dielectric, mineral oils, or any liquid. Encased and submerged circuitry and circuits can include processors, memory, network interface card (NIC), accelerators, and/or storage. As described herein, processors can be arranged on a side of a circuit board, and memory devices can be arranged in an opposite side of the circuit board. In some examples, pooled resources can be attached to one or more cards, such as memory, accelerators, application specific integrated circuits (ASICs), graphics processing units (GPUs), field programmable gate arrays (FPGAs), etc. As described herein, circuit boards with attached pooled resources may be physically placed orthogonal to circuit boards with servers (e.g., processors), so that short connector traces can provide connectivity from a server board to one or multiple pooled resource boards.

In some examples, described herein, network cabling (e.g., copper, fiber optic or others) could be connected to one or more circuit boards within a tank and exit the tank to connect to a switch as shown for example in FIG. 4. Other embodiments may provide an optical interconnect from the enclosed tank to other tanks or switch gear or utilize millimeter waveguides to connect to a switch. For example, memory pools and/or network interface devices 504 and/or 506 can be coupled to circuit boards within tank 502.

Figure 6:
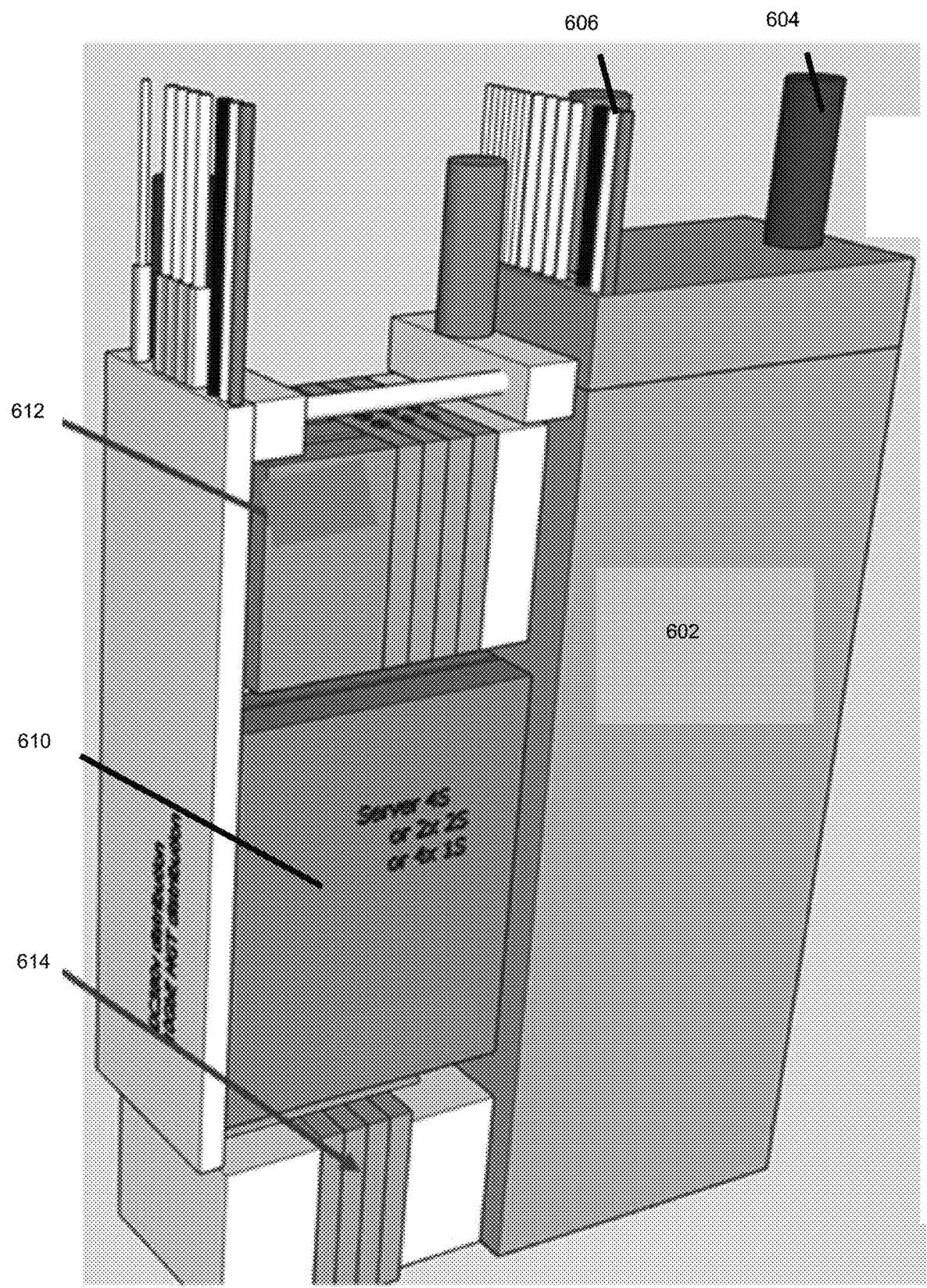
FIG. 6 depicts an example compute column internals side by side with an encasing of a compute column.

FIG. 6 depicts an example compute column internals of a tank next to an encasing of a compute column in tank 602. For example, tank 602 can include servers 610, storage class memory and NIC 612, and memory pool 614. A self-contained tank 602 can include circuit boards and circuitry and circuit boards and circuitry can be cooled by 2PILC. 2PILC can be used such that a server (with potentially no heatsinks) can be immersed into a liquid that has a relatively low boiling point. Liquids can be organic or inorganic compounds that give direct contact to silicon-based circuitry and as the silicon is used it will give off heat which is transferred into the liquid around it, causing the liquid to boil. Example liquids include variants of 3M™ Novec™ or Fluorinert™ (e.g., FC-72), which can have boiling points around 59 degrees Celsius. For example, liquid can be clear, colorless, non-conductive, non-flammable, residue free, thermally and chemically stable liquid. Liquids can be non-ionic and so do not transfer electricity, and are of a medium viscosity in order to facilitate effective natural convection. Boiling turns the liquid into a gas and the gas rises, forcing convection of the liquid. The liquid then condenses on a cold plate or water pipe and falls back into the tank as liquid for re-use. Examples are not limited thereto. Some examples use extra forced convection which helps with liquid transport and supports higher thermal design points (TDPs). Some examples use single phase immersion cooling or air cooling.

Cable 604 into tank 602 can be sealed and provide liquid, power, network connections, management. Cable 606 into tank 602 can be sealed and provide management cabling, bus connections, network. Circuit boards and devices connected to circuit boards within the tank 602 can be removed or replaced and the tank 602 resealed.

Figure 7:
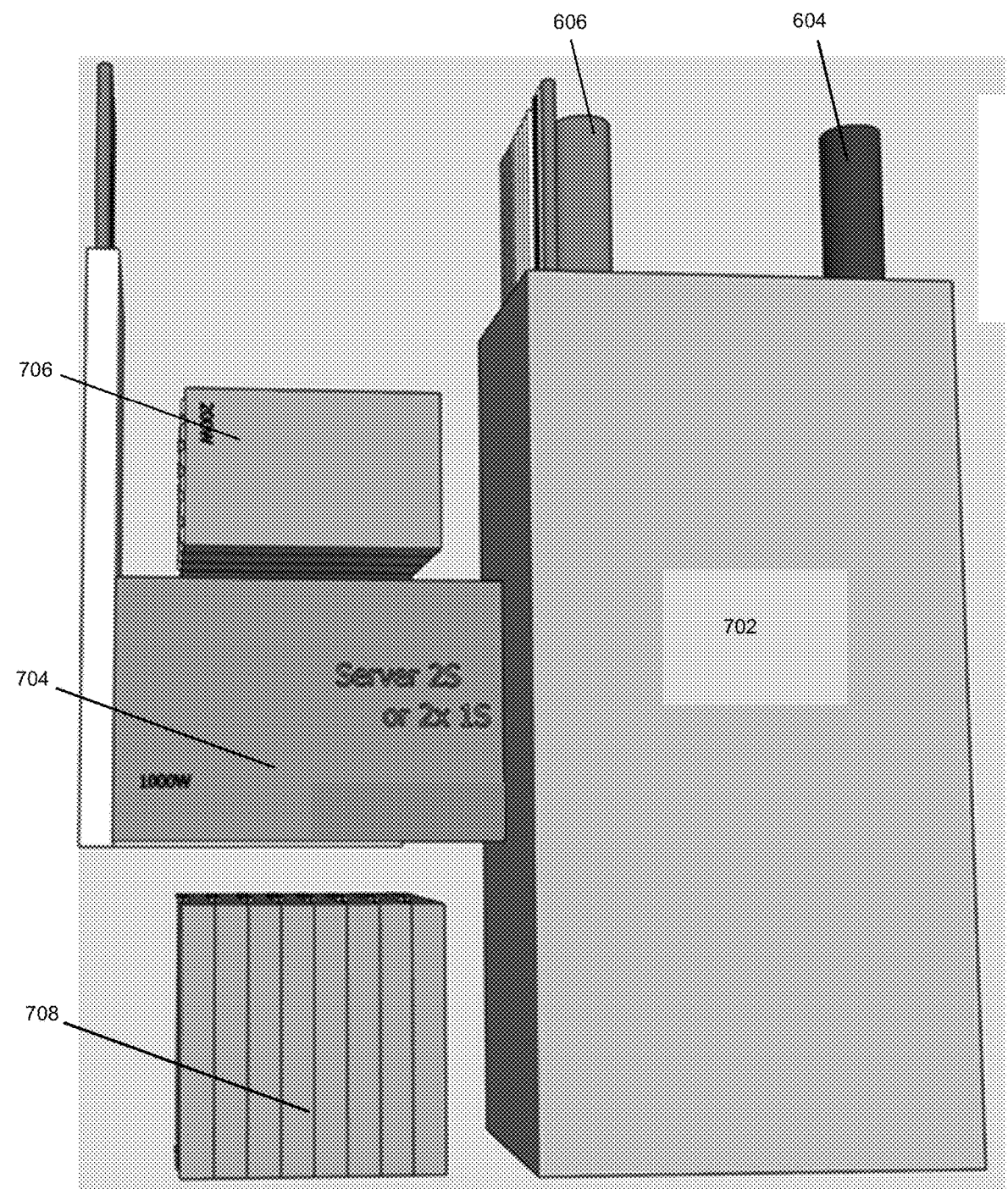
FIG. 7 depicts an example compute column internals side by side with an encasing of a compute column.

FIG. 7 depicts an example compute column internals side by side with tank encasing 702 of a compute column. Some configurations can include at least 1 socket (1S) or 2 socket (2S) servers 704 with attached memory, NIC 706, memory pools 708 (e.g., solid state drives (SSDs) and/or storage class memory (SCM)), and a power supply. A server board can be used to construct one or more of: 4×4×4 system with four 2S server systems and a pool of eight memory devices or a pool of four DDR memory devices and four devices (e.g., NICs, accelerators, etc.). However, different configurations can be provided within a tank 702.

Examples of Circuit Board Configurations

In some cases, the cost of liquid for use in immersion liquid cooling can be substantial and it is desirable to cool more devices for a particular volume of liquid. Various examples of circuit boards can increase device density on a circuit board to increase a number of devices being cooled using immersion liquid cooling. Circuit boards can be coupled using electrical connections described herein to reduce or eliminate use of cables (e.g., optical cables) to reduce a volume attributable to circuit boards, devices attached to circuit boards, and circuit board-to-circuit board connections.

Figure 8A:
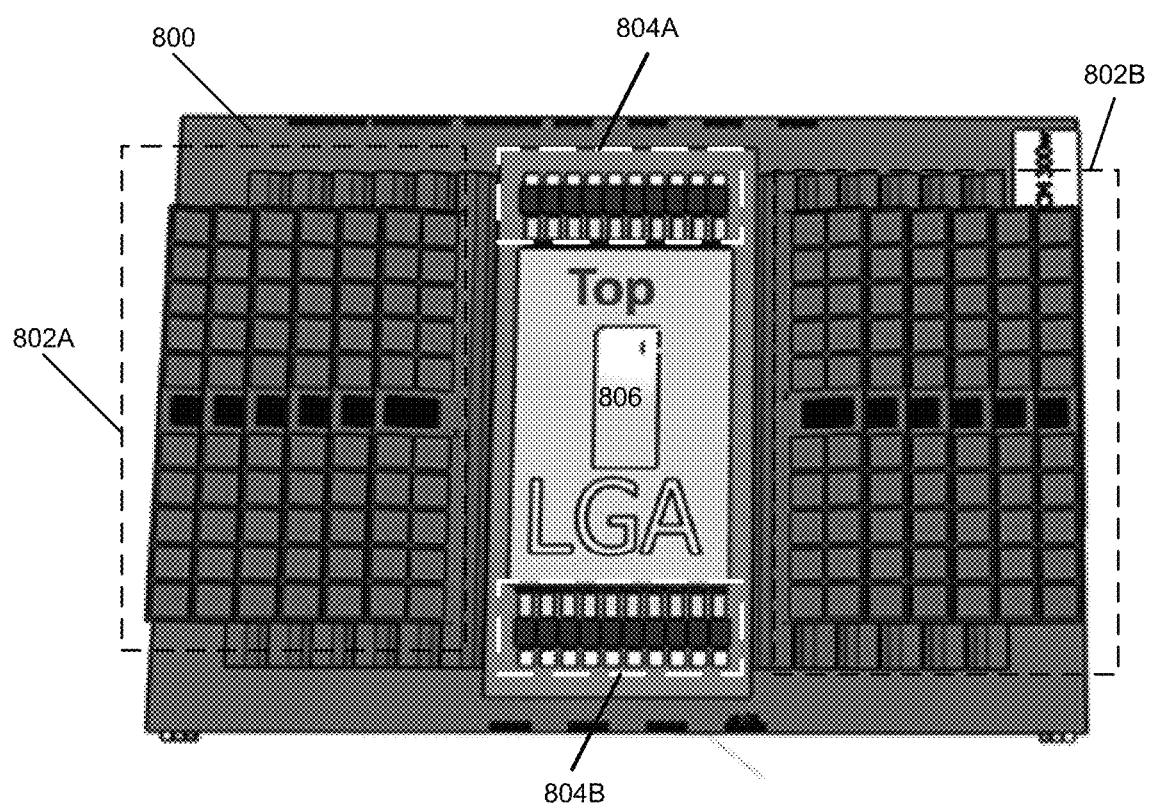
FIG. 8A shows a top-down view of circuit boards.
Figure 8A:
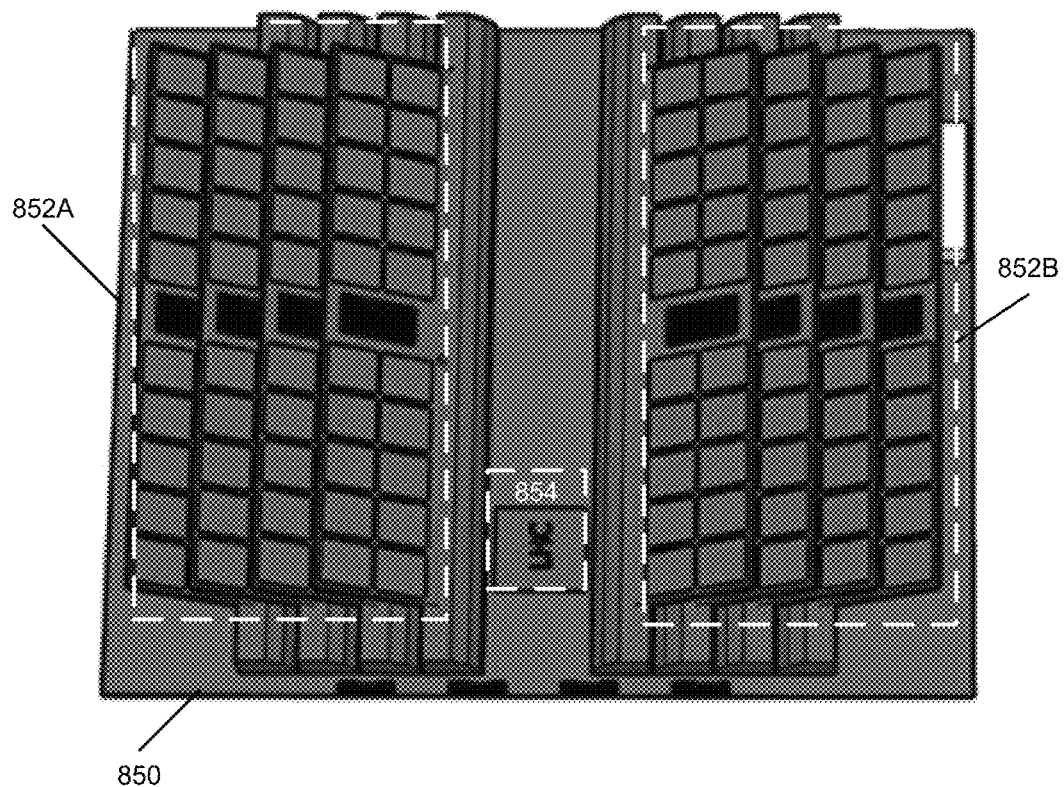

FIG. 8A shows a top-down view of circuit boards. Board 800 can include processors and memory devices coupled thereto. Dual inline memory modules (DIMMs) 802A and 802B can be connected to board 800 at an angle so that a thickness of the board with connected components is within, e.g., 1 inch profile (or other thicknesses) or the thickness can be minimized. The angle can be greater than 0 degrees and less than 90 degrees. Very low profile (VLP) DIMMs can also be used and connected to board 800. In some examples, vertical DIMM connectors can be connected to board 800 to increase memory for a motherboard footprint.

LGA 806 can provide communicative coupling with one or more processors or accelerators to at least one or more of DIMMs 802A and 802B. Voltage regulators 804A and 804B can provide power to the one or more processors or accelerators.

Memory module DIMMs 852A and 852B can be communicatively coupled to board 850 at an angle, where the angle can be greater than 0 degrees and less than 90 degrees. Pooled memory controller 854 can be conductively coupled to board 850. Boards 800 and 850 can be arranged so that an edge of board 800 is orthogonal to an edge of board 850 and devices on board 800 can communicate with devices on board 850. In some examples, although not depicted, signals can be transmitted from board 850 to board 800 or vice versa using connectors described herein, wireless communication, electromagnetic waveguides, and/or radio frequency (RF) communications. In some examples, boards 800 and 850 can be coupled to a network interface, storage, memory, and other components.

Figure 8B:
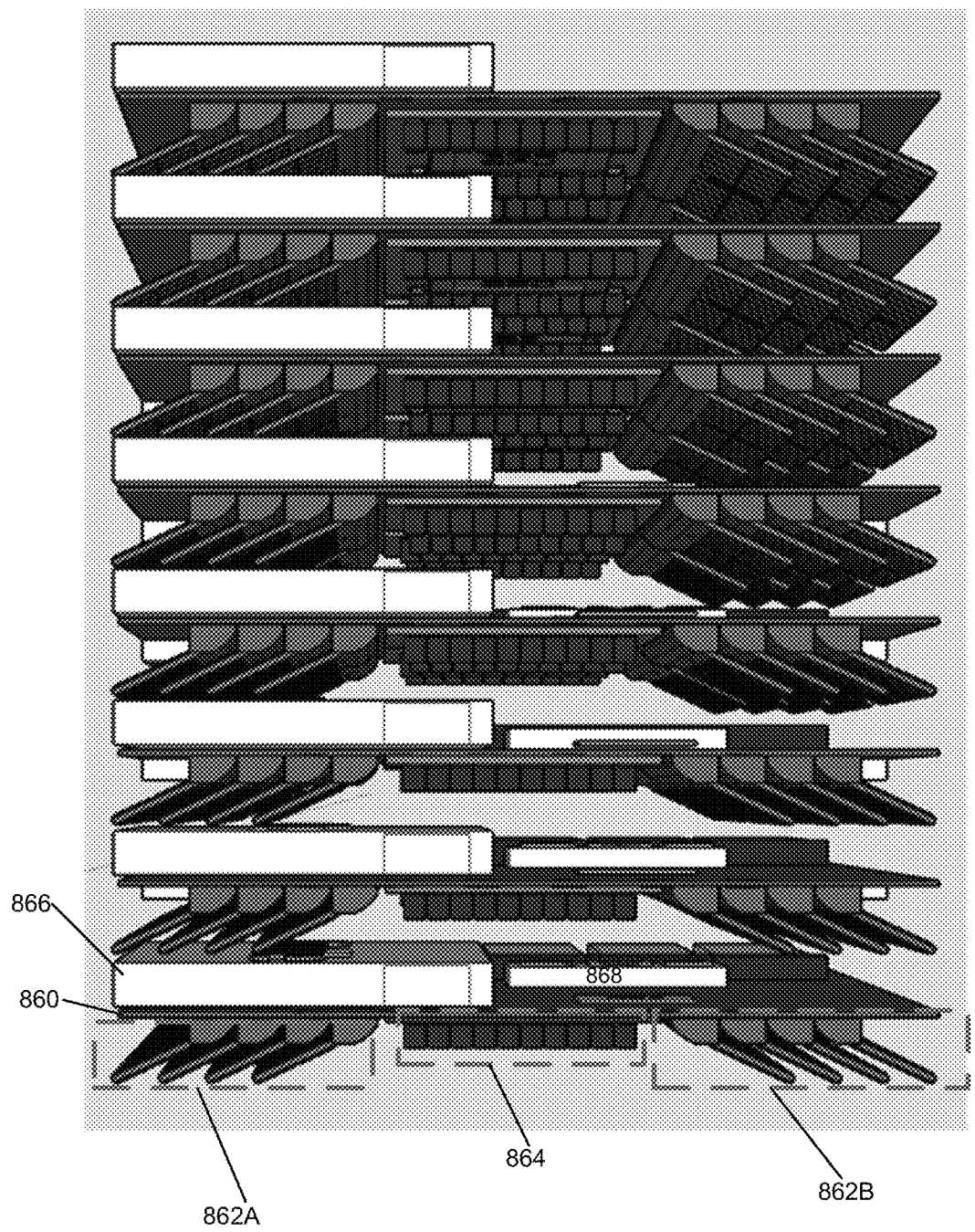
FIG. 8B shows a side view of a configuration where multiple circuit boards that illustrates a density of devices.

FIG. 8B shows a side view of a configuration where multiple (e.g., 8) boards can be arranged in a parallel orientation such that a board is approximately parallel to another board. Memory modules 862A and 862B, NIC 866, accelerator 868, and voltage regulators 864 can be connected to and conductively coupled to board 860. Other devices described herein can be connected to and conductively coupled to board 860.

Example of Board-to-Board Connectivity

Figure 9A:
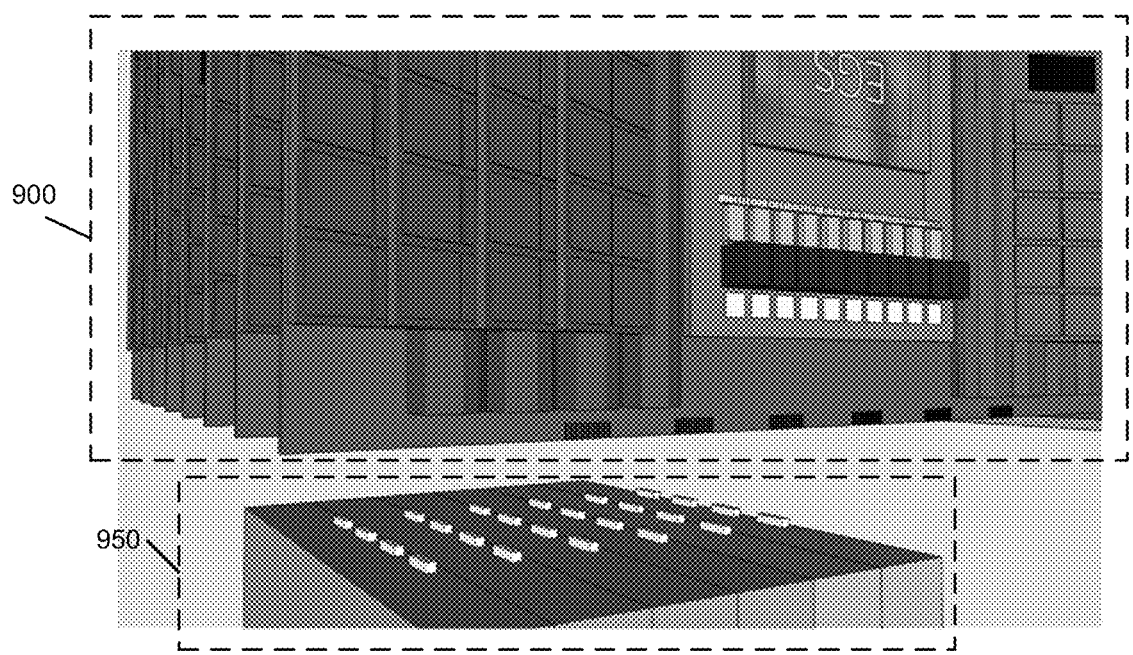
FIG. 9A shows a view of circuit boards prior to orthogonal connection with other circuit boards.
Figure 9B:
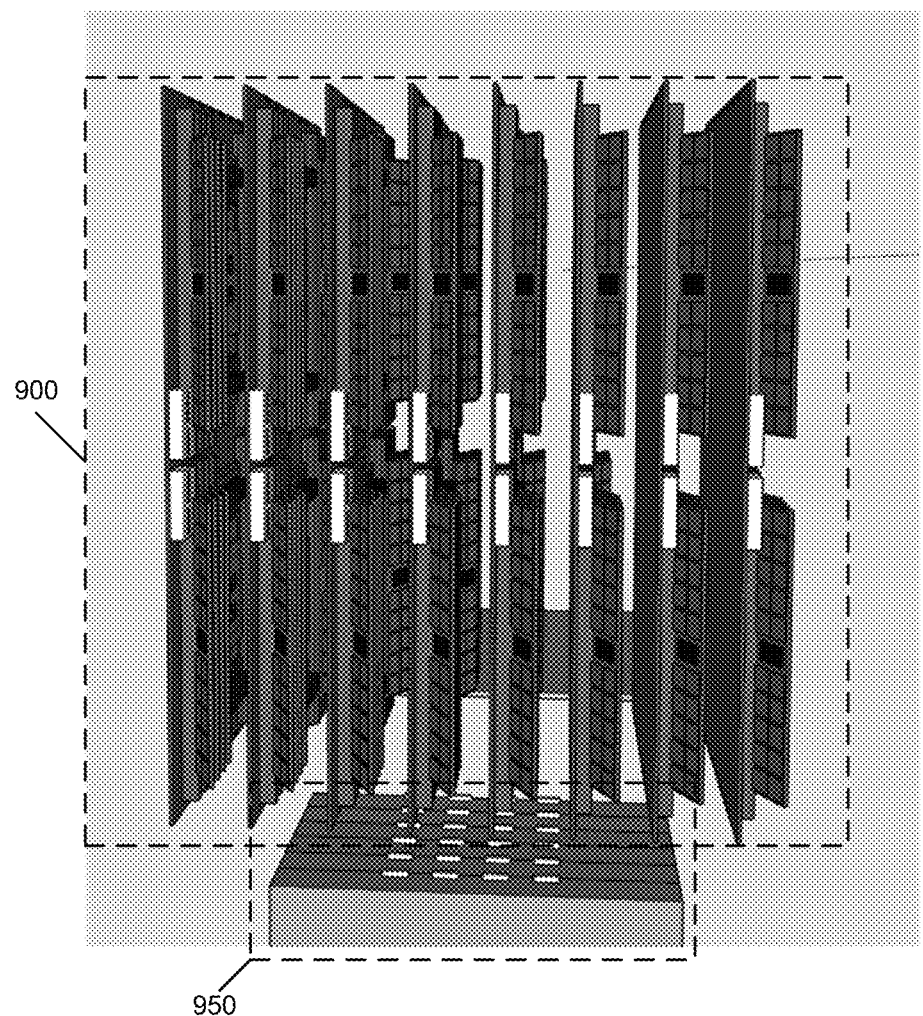
FIG. 9B shows a side and exploded view of circuit boards prior to orthogonal connection with other circuit boards.

FIG. 9A shows a view of circuit boards prior to orthogonal connection with other circuit boards. For example, circuit boards 900 can be orthogonally arranged with respect to circuit boards 950. FIG. 9B shows a side and exploded view of circuit boards prior to orthogonal connection with other circuit boards. Circuit boards 900 can be arranged so that a board among circuit boards 900 is parallel to one or more other boards among circuit boards 900. Boards among circuit boards 900 and circuit boards 950 can be interconnected using connectors, cables (e.g., optical or electrical), radio frequency (RF) waves, printed circuit board (PCB) traces, etc. In some examples, the orthogonally connected circuit boards 900 and 950 can be placed within a same container and liquid cooled using the same fluid. In some examples, a first set of one or more parallel oriented circuit boards can be placed inside a container and inside fluid, a second set of one or more parallel oriented circuit boards can be placed outside the container, and the first and second sets of circuit boards can be interconnected in a perpendicular orientation at their edges.

Figure 9C:
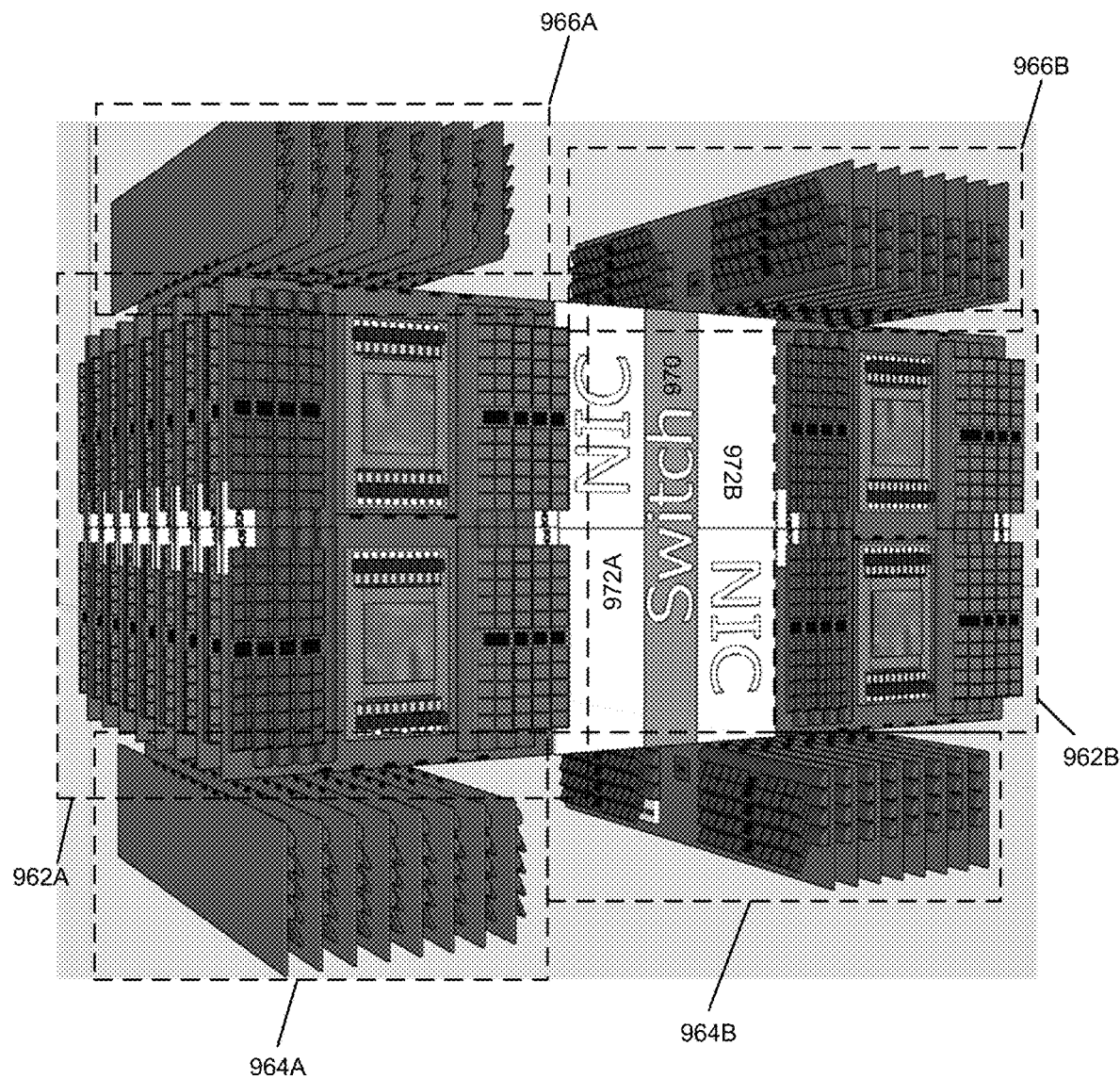
FIG. 9C depicts an example of circuit boards interconnected to other circuit boards using NICs and a switch.

FIG. 9C depicts an example of circuit boards interconnected to other circuit boards using NICs and a switch.

Edges of circuit boards 962A can be orthogonally connected to circuit boards 964A and 966A to provide communication among devices on circuit boards 962A, 964A, and 966A. Similarly, edges of circuit boards 962B can be orthogonally connected to circuit boards 964B and 966B to provide communication among devices on circuit boards 962B, 964B, and 966B. Devices on circuit board 962A can be coupled to switch 970 through NIC 972A whereas devices on circuit board 962B can be coupled to switch 970 through NIC 972B.

This configuration of circuit boards, NICs, and a switch and could be placed in a tank and at least partially covered in liquid for which 2PILC is to be applied to co-locate thermal burdens in a single tank, thereby reducing the total number of units deployed. Network and management network cabling may not be used, because the switches for those networks could be included in the tank with servers and pooled components.

Example of Orthogonal Connectivity

Motherboards can include circuit boards to which any type of processor (e.g., CPU, graphics processing unit (GPU), general purpose GPU (GPGPU), XPU, accelerator, FPGA, and so forth), network interface, switch, memory, storage, persistent memory and so forth are mounted and signals can be transmitted and received via the motherboard. Motherboards provide signal conductors such as copper traces and connectors to transmit or receive signals with other circuit boards or devices. Any number of motherboards can be connected to any number of other motherboards. Any number of flexible connectors can be used.

Figure 10A:
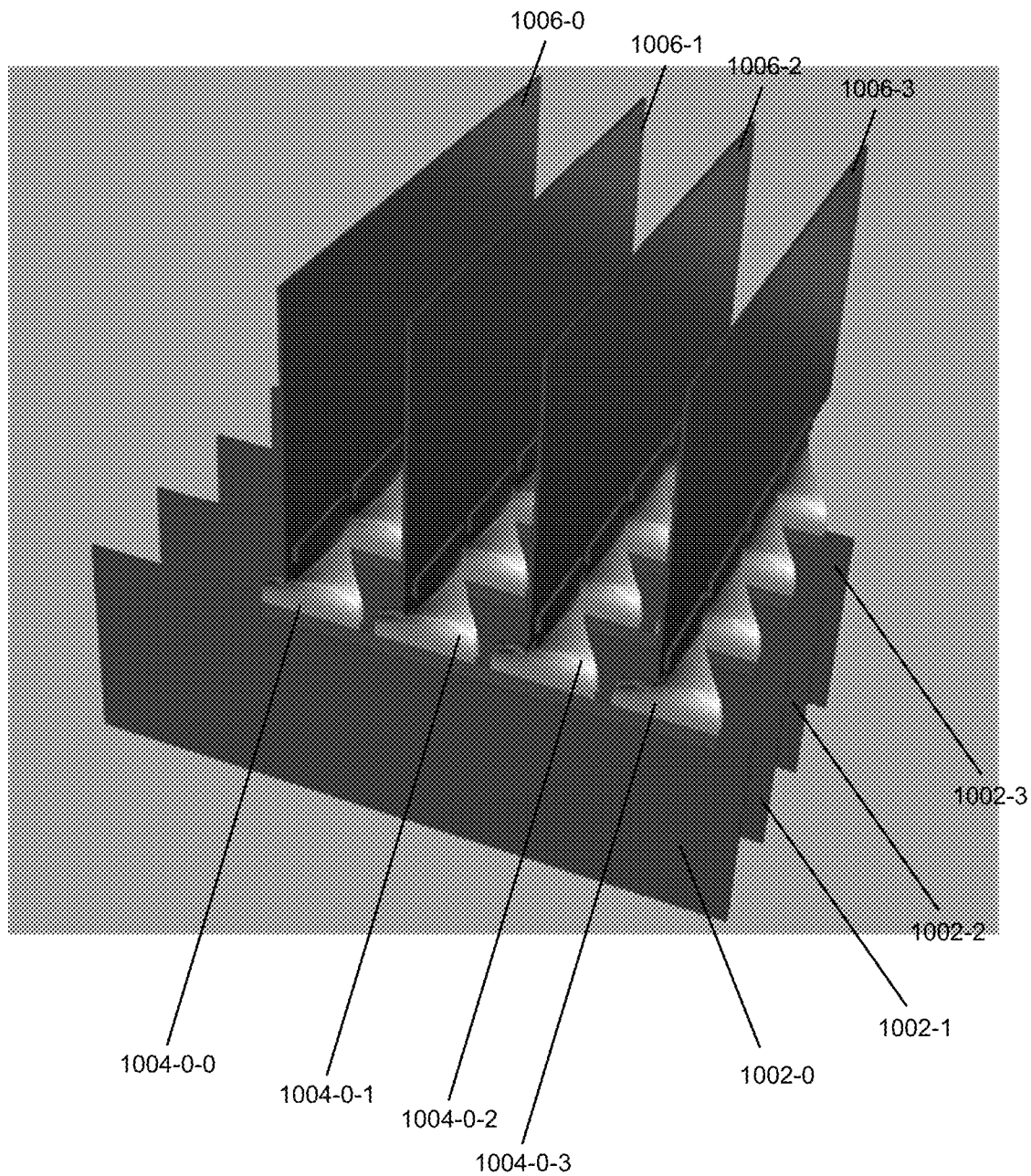
FIG. 10A depicts an example of orthogonal connectivity between four circuit boards and four other circuit boards.

FIG. 10A depicts an example of orthogonal connectivity between four circuit boards and four other circuit boards. First circuit board 1002-0 can be conductively coupled to a second circuit board 1006-0 using flexible cables 1004-0-0 to 1004-0-3. Similarly, first circuit board 1002-1 can be conductively coupled to a second circuit board 1006-1 using flexible cables 1004-1-0 to 1004-1-3. Although not depicted, similar connections can be made between first circuit board 1002-2 and 1002-3 with second circuit boards 1006-2 and 1006-3 using flexible cables. In some examples, circuit boards that are orthogonally connected can be arranged such than an edge of a first circuit board is oriented at any angle that is greater than 0 degrees and less than 180 degrees relative to an edge of a second circuit board.

First circuit boards and/or second circuit boards can be a printed circuit board (PCB). Flexible cable can include a ribbon cable formed of plastic encapsulated copper wire. The first circuit board can be conductively coupled to one or more processors and other hardware described herein. Likewise, the second circuit board can be conductively coupled to one or more memory devices and resources other hardware described herein. To cool components on the motherboards, airflow or fluid can flow up and between the flexible cables for orthogonal connectivity. Although not depicted, another edge of first circuit board can be coupled to another parallel arrangement of circuit boards using flexible cables for orthogonal connectivity. Likewise, another edge of second circuit board can be coupled to another parallel arrangement of circuit boards using flexible cables for orthogonal connectivity.

Figure 10B:
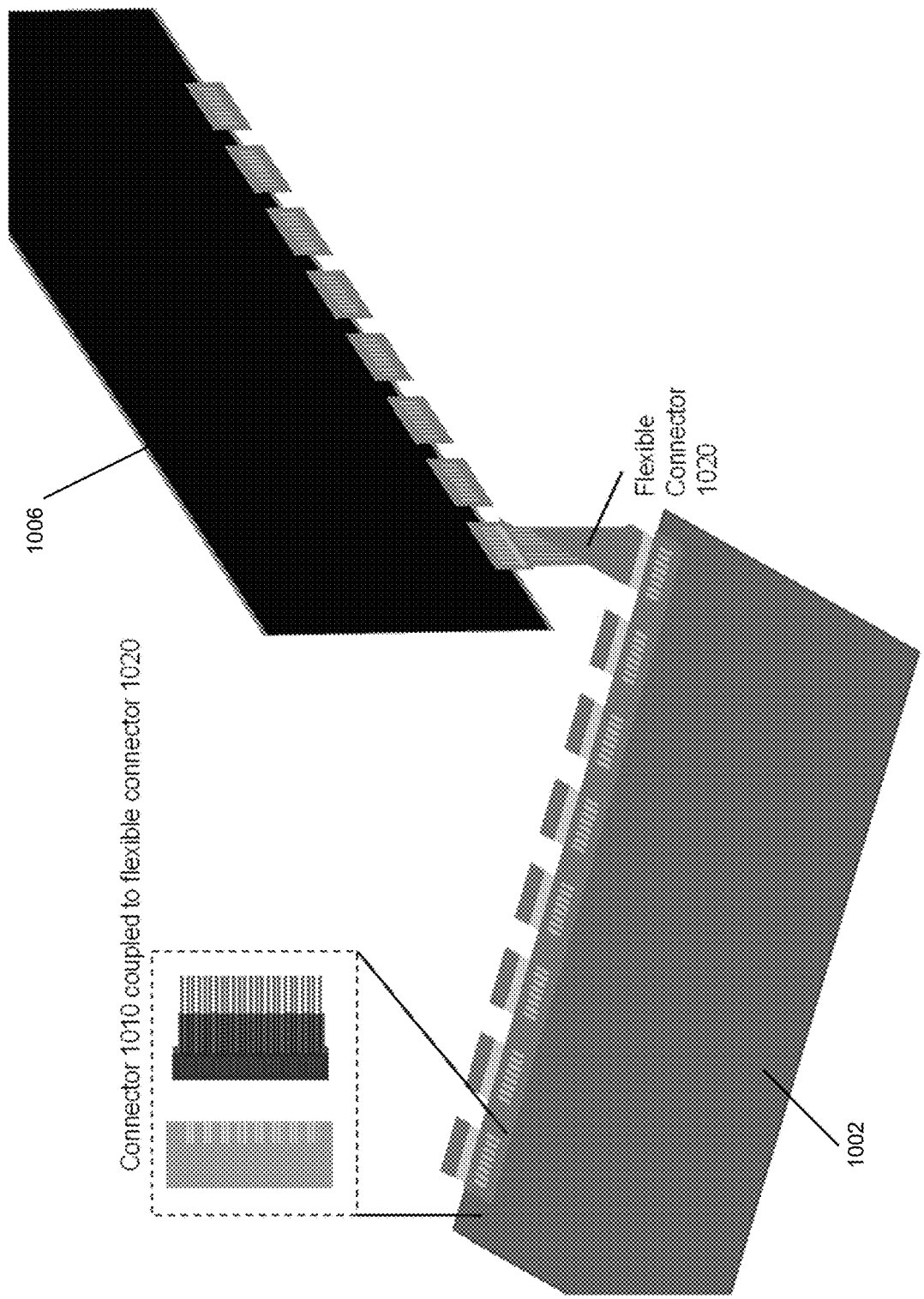
FIG. 10B depicts an example of a connection of a first circuit board to a second circuit board.

FIG. 10B depicts an example of a connection of a first circuit board to a second circuit board. Flexible connector 1020 can provide a signal path with set impedance level. Flexible connector 1020 can retain a shape after bent into a particular shape. An end piece of flexible connector 1020 can be soldered to a connector on a Removeable Grid Array (RGA) connector 1010. Connector 1010 can be soldered to, or otherwise attached to, first circuit board 1002 to provide a conductive connection and attachment. First circuit board 1002 can include a trace (not shown, but described herein) inside a printed circuit board (PCB). For example, the trace can be supplied with current, from a current source, to heat up and melt solder connection (e.g., balls or strip) to fuse conductors from ends of flexible cable 1020 to conductors of connector 1010 as described herein. The current source can be a Pulse Width Modulation (PWM) power controller which both monitors and heats the solder connector area to liquefy (melt) the solder for installation and removal of conductors of the flexible ribbon cable. Solder regions can be arranged in a strip or grid.

As described herein, during insertion of conductors of flexible connector 1020 to contact conductors of connector 1010 attached to first circuit board 1002, a guide of flexible connector 1020 can provide contact between a conductor end of flexible connector 1020 with a corresponding conductor of connector 1010. The guide can provide a pressure that presses a conductor end of flexible connector 1020 to a corresponding conductor of connector 1010 at least when current is applied and the conductor end of flexible connector 1020 fuses to the corresponding conductor of connector 1010 to hold the conductor end of flexible connector 1020 in place against a landing zone. The guide can provide contact between multiple different conductor ends of flexible connector 1020 and multiple different corresponding connections of connector 1010.

Application of additional current to the trace can heat the trace and melt a metal connection between one or more conductor ends of flexible connector 1020 and corresponding connectors of connector 1010 to allow for detachment of flexible connector 1020 and its conductors from connectors of connector 1010. To remove a connection between connector 1010 and flexible connector 1020, current can be run through the heater conductors to melt the metal contacts and break the bond. Another board with same bondable material can be inserted and connected to the metal contacts. Accordingly, an array of solder regions or leads on connector 1010 can be re-solderable. Further, since the connection does not require mechanical friction which can ebb over time due to micro-motion, the insertion force to form a conductive connection between different boards can be reduced.

Bending of flexible connector 1020 can allow for tolerance in forming fusing conductor ends of a flexible cable and solder connections of a circuit board. Flexible cables can exhibit a thinner profile of connectors compared to EXA connectors. By contrast, rigid connectors can require very precise soldering locations and insertion force.

Figure 10C:
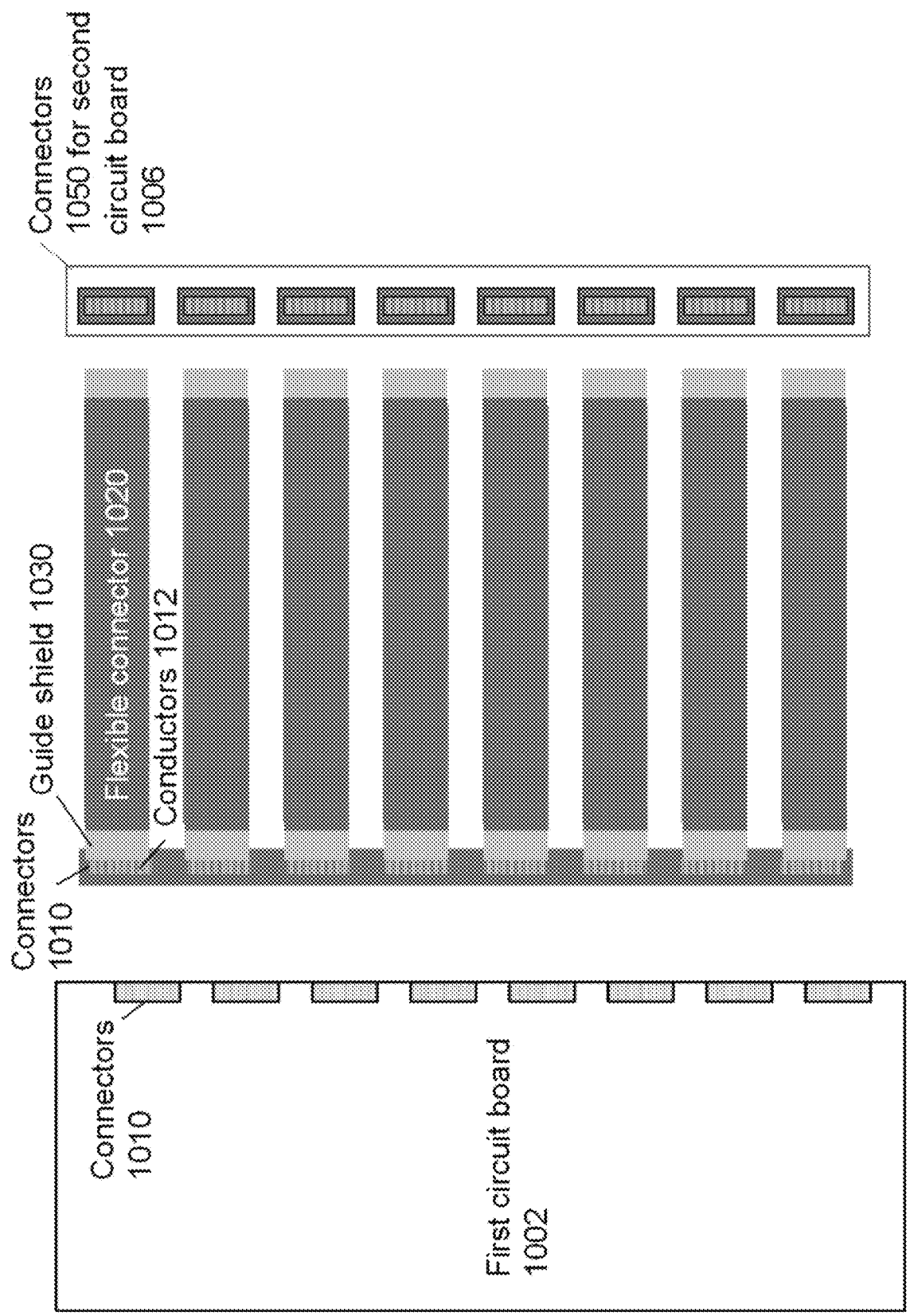
FIG. 10C depicts an exploded view of connectors of a first circuit board and flexible conductors.

FIG. 10C depicts an exploded view of connectors of a first circuit board and flexible conductors. As shown, first circuit board 1002 be attached (e.g., via solder) to connectors 1010. Connectors 1010 can include conductors 1012 that are conductively connected to corresponding conductors (now shown) of a first circuit board 1002. Flexible connectors 1020 can couple connectors 1010 of first circuit board 1002 to conductors of a connector 1050. Connector 1050 can be conductively coupled to and affixed to second circuit board 1006 using solder or other technologies.

FIG. 10D depicts an example of electrical conductors and a guide shield for use to connect a conductor end of a flexible connector to a corresponding connector on the motherboard. Conductor ends of flexible connector can be coupled to a circuit board (e.g., PCB) underneath a molding region 1024. Molding region 1024 can cause the conductors of circuit board 1022 to contact conductors 1012 of connectors 1010. In some examples, conductors 1012 can be on a surface of first circuit board 1002 instead of conductors 1012 being part of connector 1010, which is in turn affixed and conductively connected to first circuit board 1002. An embedded trace in first circuit board 1002 can heat up solder regions at conductors 1012 by current conduction and cause solder regions to melt and form a contact between conductors 1012 and a conductor end of circuit board 1022 beneath molding region 1024.

Figure 10E:
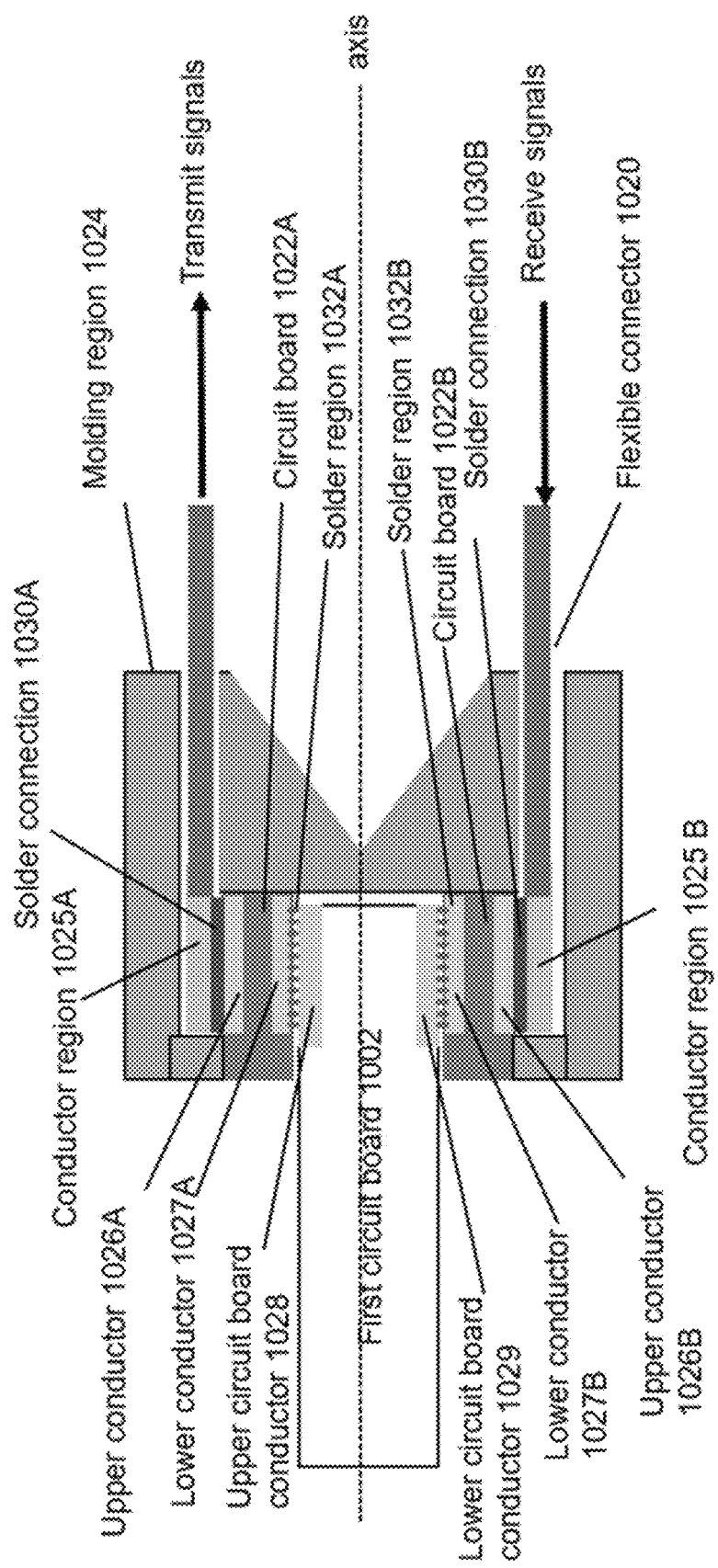
FIG. 10E shows an example side view of a clamp structure to connect to conductors on first and second sides of a motherboard.

FIG. 10E shows an example side view of a clamp structure to connect to conductors on first and second sides of a circuit board. Molding region 1024 can include flexible plastic to provide structural support and strength to flexible connector 1020 and springs to open or clamp conductors 1025 of flexible connector 1020 to upper circuit board conductor 1028 and lower circuit board conductor 1029 on opposite sides of first circuit board 1002. As described herein, conductors 1028 and 1029 can be coupled to respective exposed copper wire conductors 1025A and 1025B extending from flexible cables of flexible connector 1020.

Solder connection 1030A can provide a solder connection between conductor region 1025A extending from flexible connector 1020 and upper conductor 1026A. Solder connection 1030B can provide a solder connection between conductor region 1025B extending from flexible connector 1020 and upper conductor 1026B. Circuit board 1022A can include PCB regions to which upper conductor 1026A and upper conductor 1027A (e.g., electrical signal conductors) are attached. Circuit board 1022B can include PCB regions to which lower conductor 1027B and upper conductor 1026B (e.g., electrical signal conductors) are attached. Upper conductor 1026A can be conductively coupled to lower conductor 1027A through circuit board 1022A using copper traces or other electrical signal conductor. Upper conductor 1026B can be conductively coupled to lower conductor 1027B through circuit board 1022B using copper traces or other electrical signal conductor.

Solder region 1032A can provide conductive coupling and adhesion between lower conductor 1027A and upper circuit board conductor 1028. Solder region 1032A can be shaped as one or more balls or one or more strips. Solder region 1032B can provide conductive coupling and adhesion between lower conductor 1027B and lower circuit board conductor 1029. Solder regions 1032A and 1032B can include lead-free alloy that contains 96.5% tin, 3% silver, and 0.5% copper (e.g., SAC305). Solder regions 1032A and 1032B can include a material (e.g., Sn—Bi—Ag with a melting temperature $T_{melt}$ of approximately 138° C.) that, when melted, forms a connection between conductors. Solder regions 1032A and 1032B can melt at a lower temperature than solder connections 1030A and 1030B in some examples. A connection can be formed by subjecting solder to high temperature to fuse the junction region to at least one conductor (e.g., metal such as copper).

In some examples, first circuit board 1002 and orthogonal connector system can be symmetrical around the axis shown with transmit signals sent through the connectors above the axis and receive signals received at the connectors below the axis (although the opposite convention can be used or transmit and receive can be mixed above and/or below the axis). In some examples, first circuit board 1002 includes conductors on a single side and conductive coupling can be formed with merely upper circuit board conductor 1028 or lower circuit board conductor 1029 and transmit and receive signals are sent using conductors among upper circuit board conductor 1028 or lower circuit board conductor 1029.

Although not depicted, the orthogonal connection can be formed on a second circuit board in a similar manner so that flexible connector 1020 connects first and second circuit boards. For example, the flexible orthogonal connectors can be coupled to conductors of two circuit boards using the orthogonal connector systems. Flexible connectors 1020 can twist 90 degrees in a folded over L shape or other angles or shapes to allow orthogonal orientation (or other orientation) between circuit boards. Flexible connector 1020 can hold its shape after being bent and can be re-bent to another shape. Multiple connections can be provided between boards using various protocols such as those referenced herein.

Figure 11A:
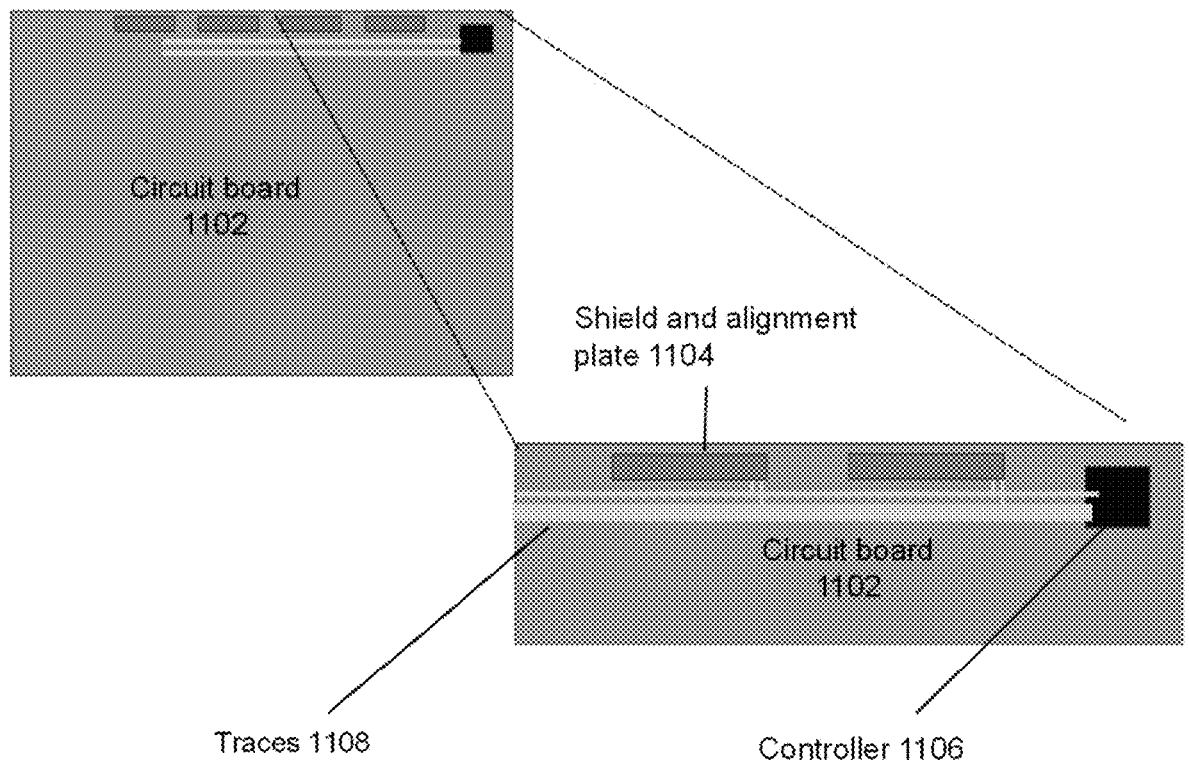
FIG. 11A depicts an example of a circuit board for connection to another circuit board or wires of a flexible connector.

FIG. 11A depicts an example of a circuit board for connection to another circuit board or wires of a flexible connector. Shield and alignment plate 1104 can guide wire ends or conductors of a flexible connector to connect to corresponding connectors on circuit board 1102. Shield and alignment plate 1104 can be attached to circuit board 1102 by soldering or press fit. Traces 1108 can be embedded in circuit board 1102. A thicker trace can be ground and a thinner can provide current. Controller 1106 can control an amount of current supplied through traces 1108 and when current is supplied through traces in board in order to heat solder connections under shield and alignment plate 1104. Controller 1106 can include a current source or a PWM power controller which generates current provided through traces 1108. Controller 1106 can provide power through traces 1108 to direct heating to specific locations near the solder connection to melt the solder connection on top of circuit board 1102 but under shield and alignment plates 1104. For example, copper traces can be located inside motherboard and specifically heat up a specific region of motherboard near the solder connections to, for example, 150 degrees Celsius to melt solder connections that melt at 138 degrees for Sn—Bi—Ag low temperature solder for example.

In some examples, controller 1106 can utilize a software interface such that an input from a data center administrator or use of a configuration file can activate controller 1106 to generate current to form a conductive and physical attachment of different parts.

Figure 11B:
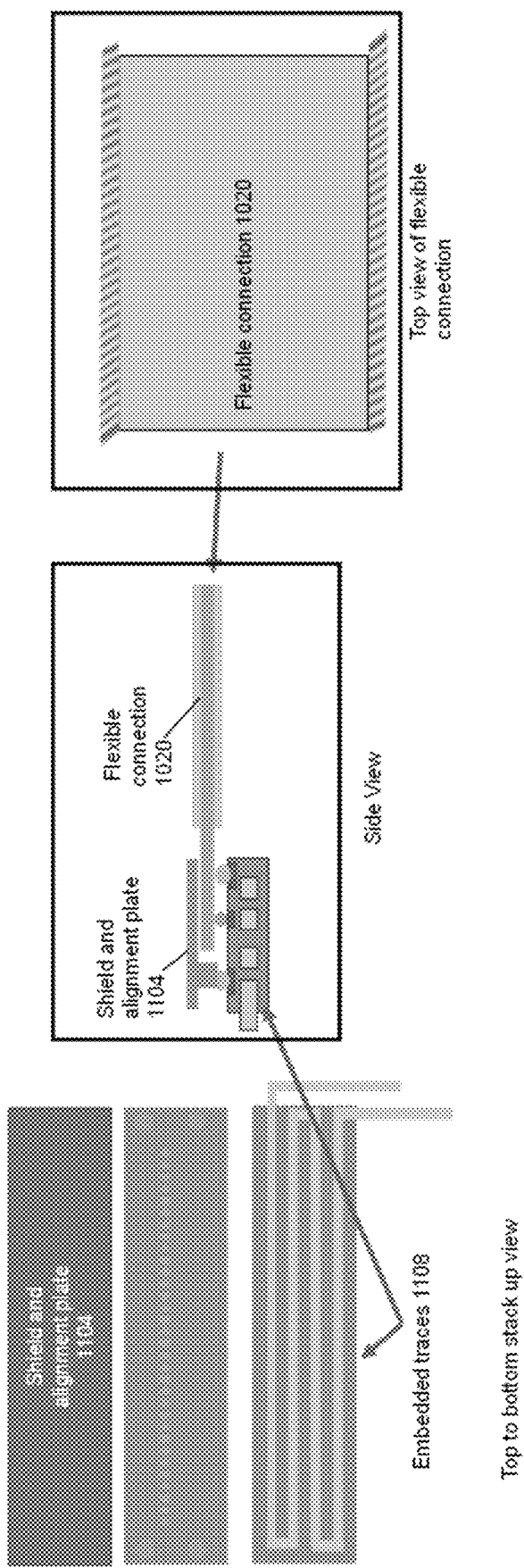
FIG. 11B depicts an example of views of a system that can supply current to a trace to heat a solder connection to form a connection with conductors of a flexible connector.

FIG. 11B depicts an example of views of the system of FIG. 11A in which a system can supply current to a trace to heat a solder connection to form a connection with conductors of a flexible connector. Embedded traces 1108 can be placed within a substrate of printed circuit board to be proximate to conductors of the circuit board but electrically isolated from the conductors. Shield and alignment plate 1104 can be attached to a surface of the printed circuit board and provide a guide to guide a conductor of the flexible connector to contact with an associated conductor on the circuit board. Shield and alignment plate 1104 can be composed of a phenolic, polyimide or non-conductive materials. Flexible connector 1020 can include a flexible rigid flex cable with a sheathing covering internal conductive wires.

Figure 12A:
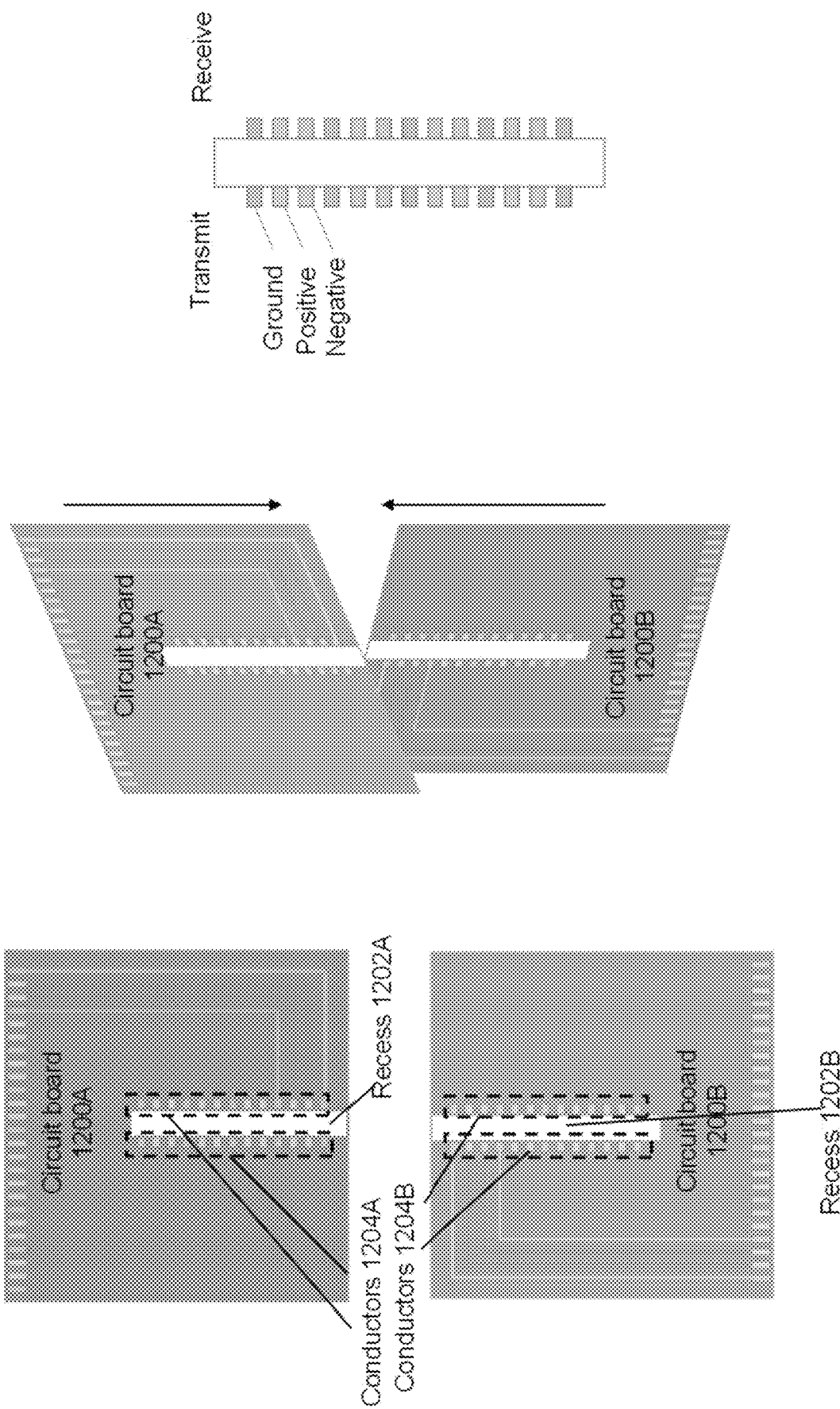
FIG. 12A depicts an example of a manner of forming connections between electrical contacts on circuit boards arranged in an orthogonal manner.
Figure 12B:
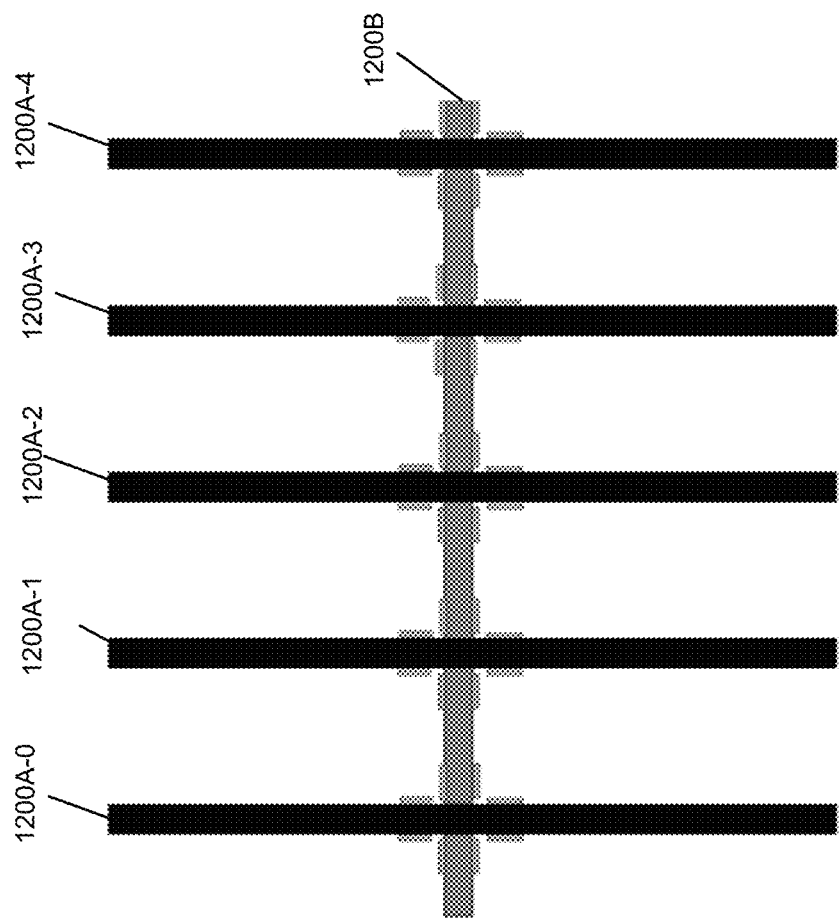
FIG. 12B shows a top view example of boards arranged orthogonally by coupling of recesses or slots of different boards.

FIG. 12A depicts an example of a manner of forming connections between electrical contacts on circuit boards arranged in an orthogonal manner. Circuit boards 1200A and 1200B can have respective recesses 1202A and 1202B, slots or openings such that circuit boards 1200A and 1200B can be mechanically connected and secured or mounted to each other by sliding a board's recess into another board's recess until a circuit board is reached. Sliding a recess of a card into another recess of another card can lead to alignment of conductors 1204A and 1204B on and conductive coupling among pins of conductors 1204A and 1204B.

FIGS. 12B-12E show different perspectives of a manner of orthogonally coupling connections of circuit boards. FIG.

Figure 12C:
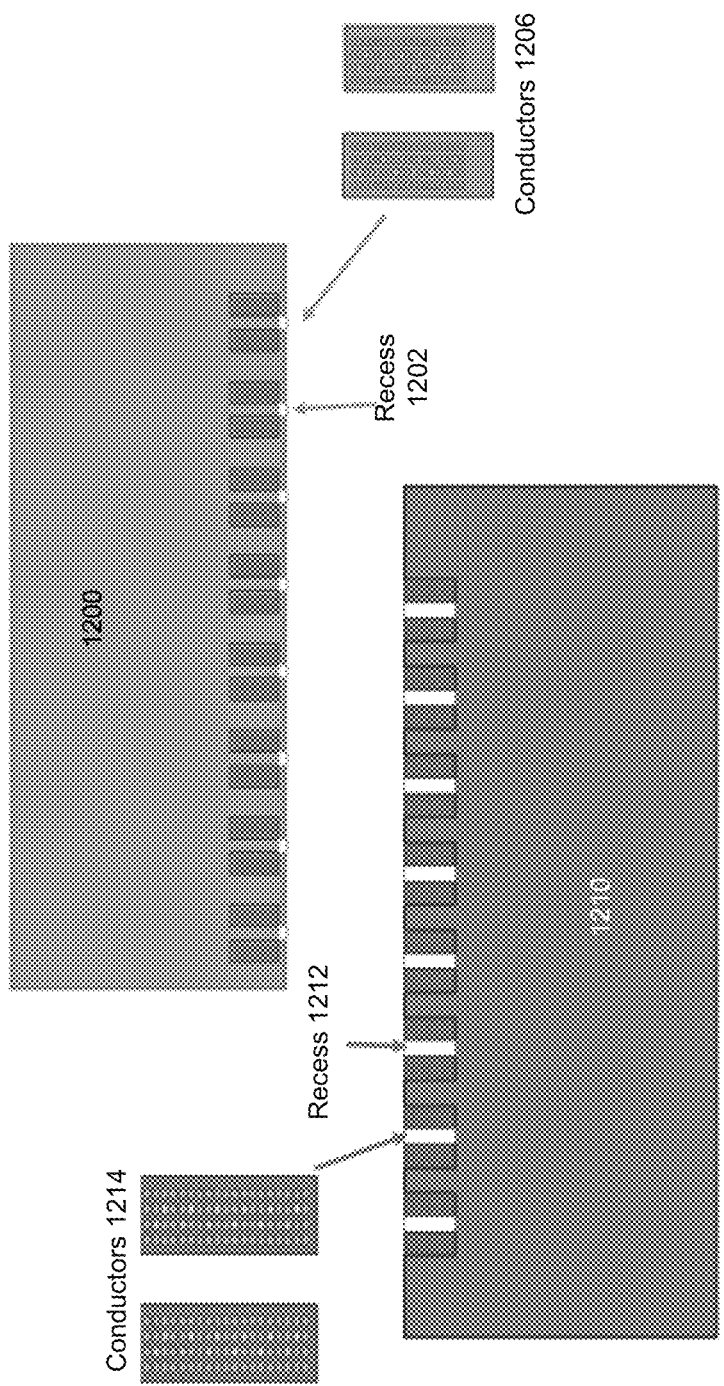
FIG. 12C shows that a circuit board (green colored card) with conductive couplings (conductors) and a recessed guide slot opening (white colored region) can slide into a recess (white colored region) in another card (red colored card).

12B shows a top view example of boards arranged orthogonally by coupling of recesses or slots of different boards. For example, recesses of boards 1200A-0 to 1200A-4 can be inserted into recesses of board 1200B so that conductors are aligned. FIG. 12C shows that a circuit board 1210 with conductive couplings 1214 and at least one recessed guide slot opening 1212 can slide into recess 1202 in circuit board 1200. Recesses 1202 in board 1200 can be a same or different length than that of recesses 1212 in board 1210. After insertion of recesses into one another with the boards arranged orthogonally, conductors 1206 and 1214 can be conductively coupled together in manners described herein.

Figure 12D:
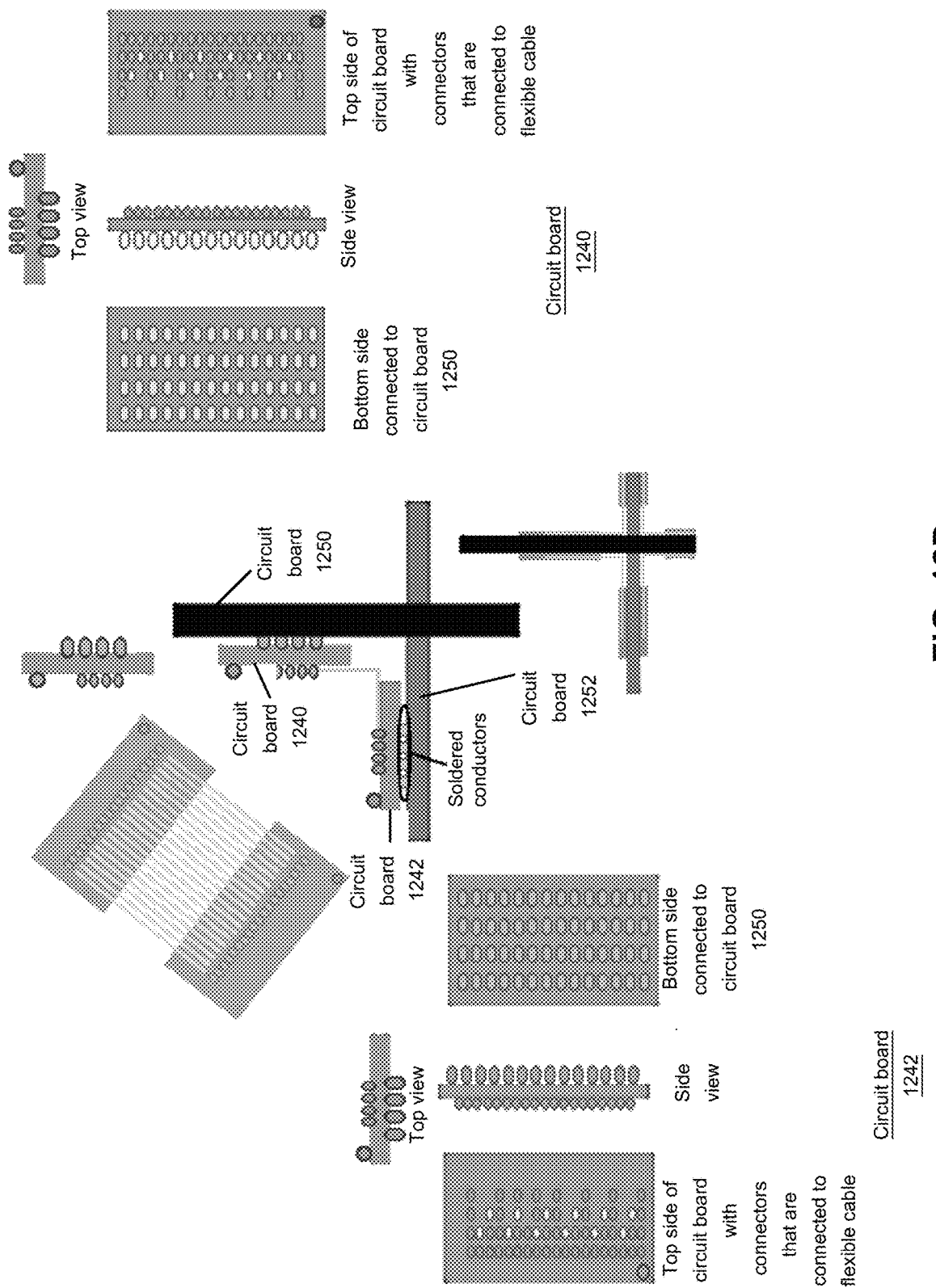
FIG. 12D depicts an example of conductive coupling of conductors on a board to conductors on another board.

FIG. 12D depicts an example of conductive coupling of conductors on a board to conductors on another board using flexible cables after insertion of boards into complementary recesses. For example, circuit boards 1240 and 1242 can be arranged in a reverse L shaped manner or L shaped manner where the cables provide the right angle. Conductors on circuit board 1240 can be soldered to a circuit board 1250 and conductors on circuit board 1242 can be soldered to circuit board 1252 to provide conductive coupling between devices coupled to circuit boards 1250 and 1252.

Figure 12E:
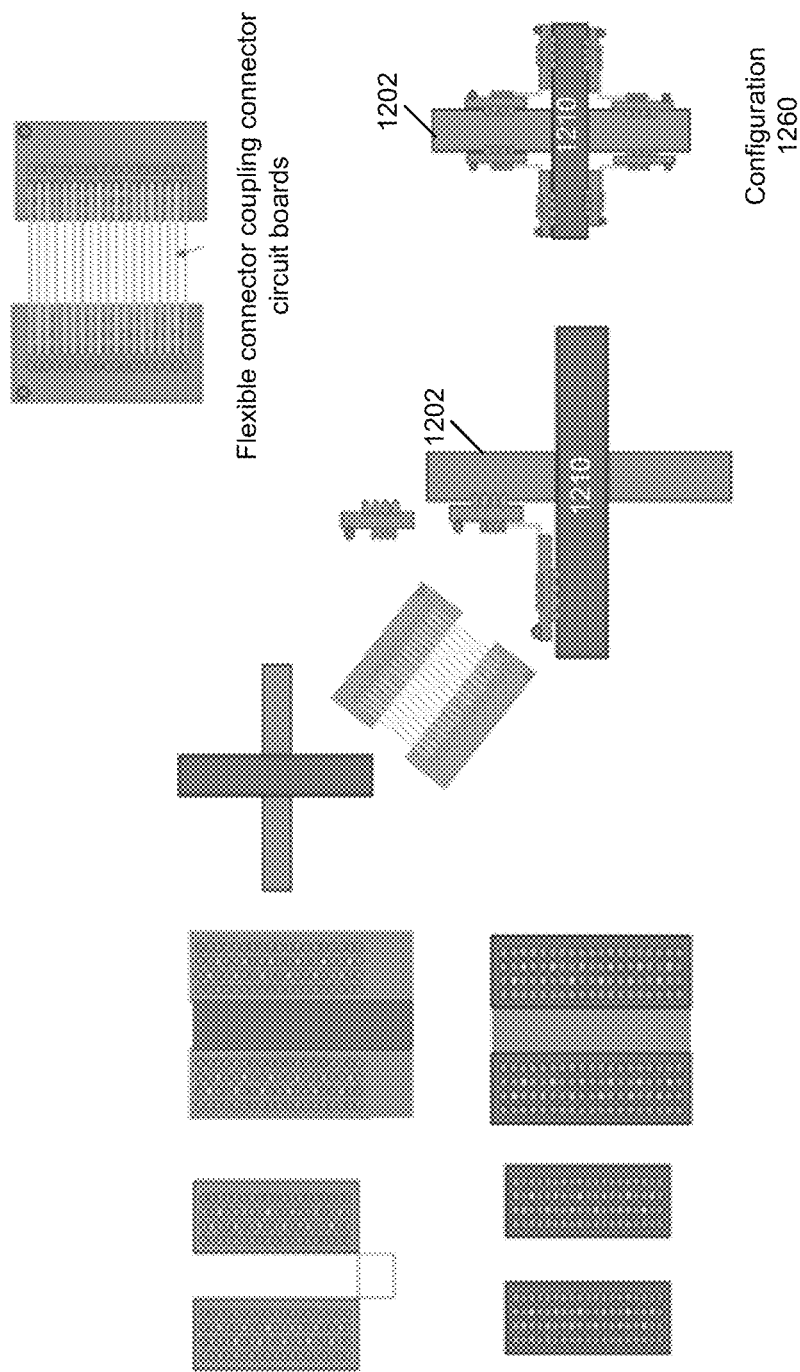
FIG. 12E shows an example where conductors on two sides of a motherboard are conductively coupled to conductors of a second motherboard by use of rigid flex cable and connector PCBs.

FIG. 12E shows an example configuration 1260 where conductors on opposite sides of a circuit board are conductively coupled to conductors of a second circuit board by use of flexible conductor and connector circuit boards. The flexible conductor can be bent at approximately 90 degrees or other angles. Connector circuit boards can be affixed to different circuit boards that are orthogonally mounted together using soldering or other techniques to form a rigid conductive coupling. L-shaped or reverse L-shaped connector circuits can be formed using bendable cable and circuit boards. L-shaped or reverse L-shaped connector circuits can be affixed on both sides of the circuit boards using soldering or other techniques.

Figure 13:
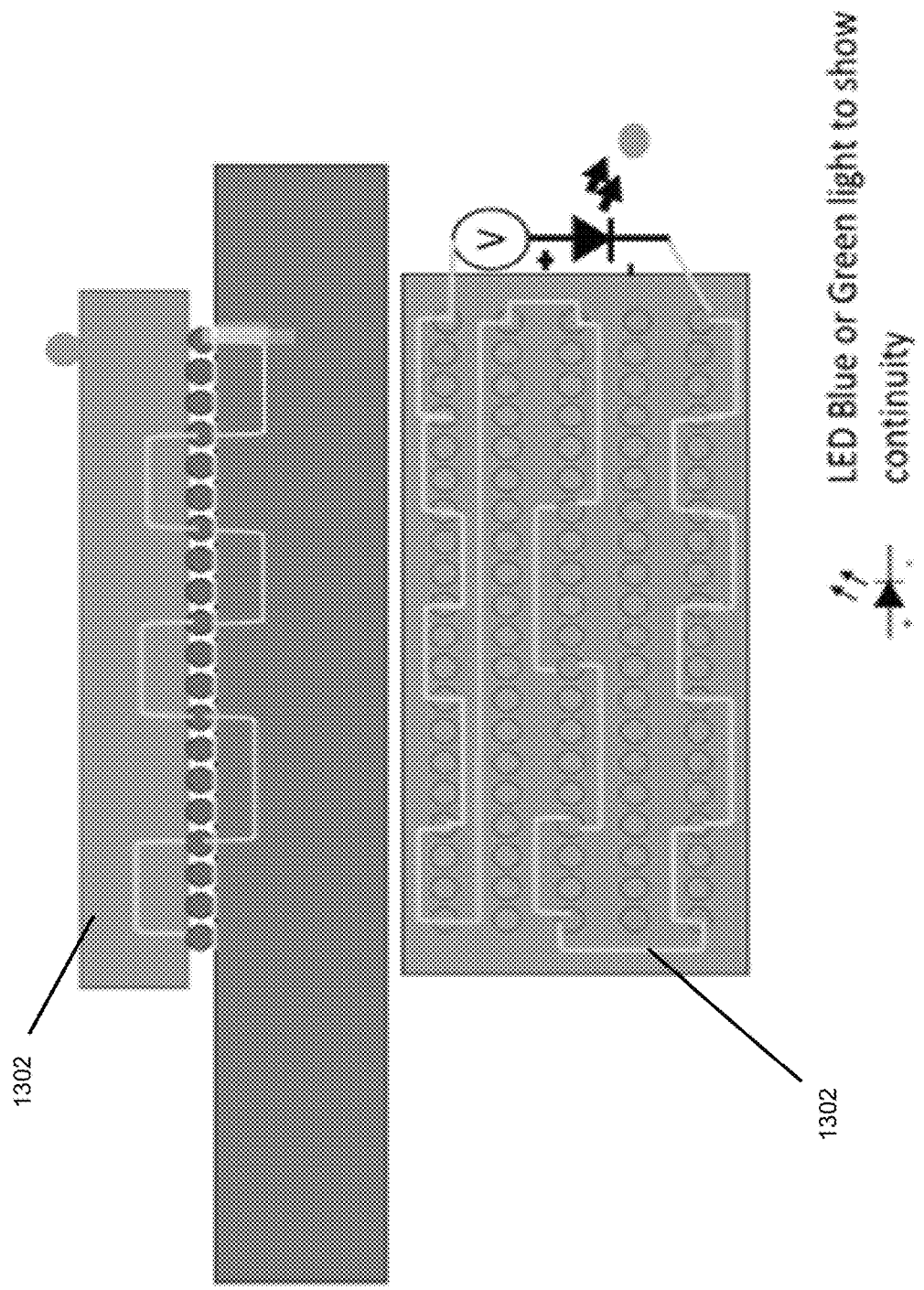
FIG. 13 shows use a light to indicate that can indicate whether solder joints are successfully formed.

FIG. 13 shows use a light to indicate that can indicate whether solder joints are successfully formed. A built-in test can be used to determine if conductive coupling between conductors has been successful before and/or after soldering of conductors together has occurred. Solder balls not used for conductive coupling of data or control signals can be connected by daisy chained conductive connection 1302 that is routed through first and second motherboards. Transmission of a signal through the daisy chained conductive connection can via emission of light from a diode can indicate successful connection of the solder balls.

Figure 14A:
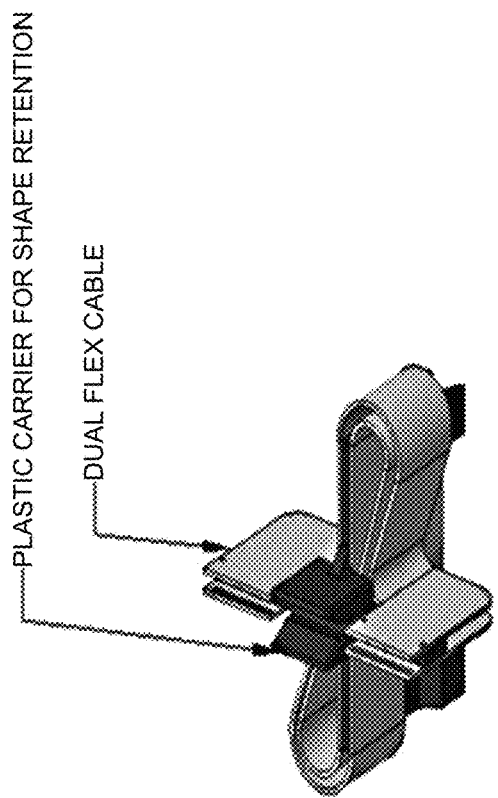
FIGS. 14A and 14B show bent cable and clips are used to form an orthogonal orientation between circuit boards. Soldering can also be used to couple conductors on the ribbon to conductors on a board. Conductors can be provided on an inside of the ribbons as shown.
Figure 14A:
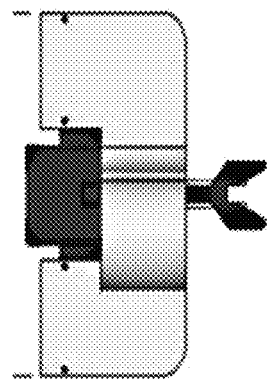
Figure 14A:
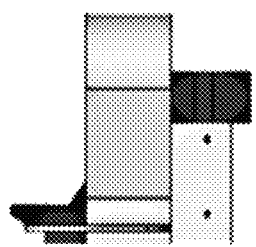
Figure 14A:
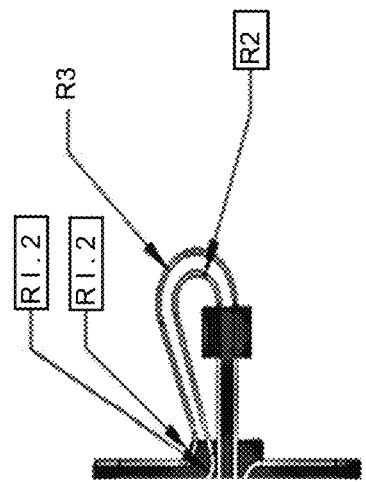
Figure 14B:
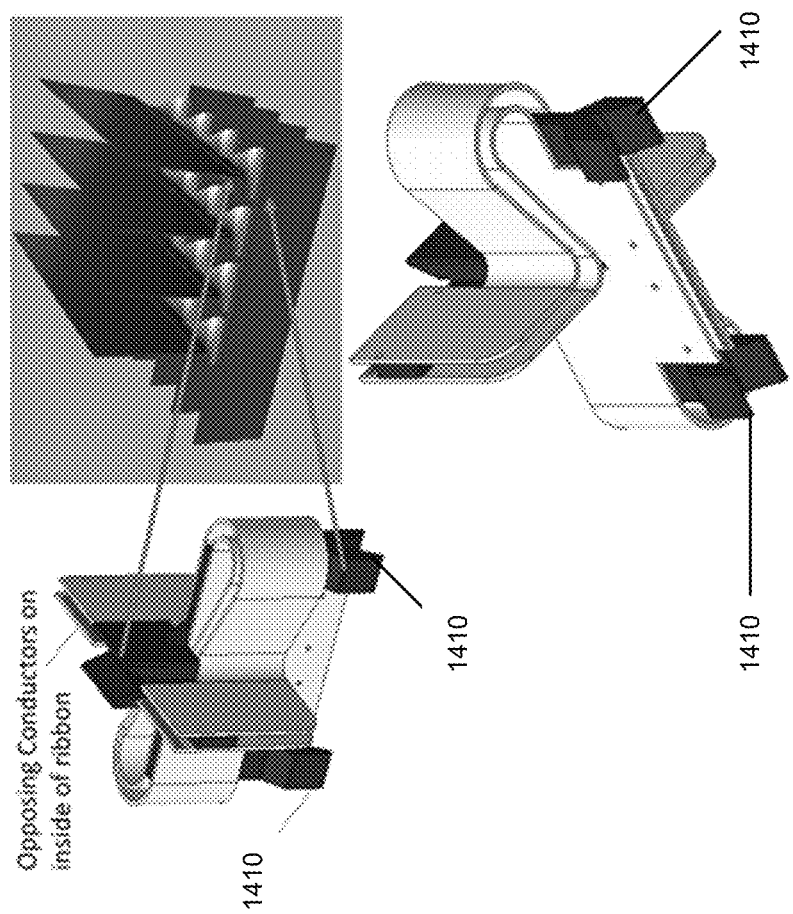

FIGS. 14A and 14B show bent cable and clips are used to form an orthogonal orientation between circuit boards. Soldering can also be used to couple conductors on the ribbon to conductors on a board. Conductors can be provided on an inside of the ribbons as shown. Clips 1410 can be used to affix flexible conductors to a circuit board.

Examples of Circuit Board Designs

CPU sockets can require a high level of force to actuate connections with a circuit board and can limit compute density by pushing memory devices or other devices out and away from the CPU and utilizing a backing plate on the backside of the board that makes trace lengths longer and can limit signal transmission rates. Some examples include a first circuit board with one or more processors attached and conductively coupled thereto. A voltage regulator can be attached and conductively coupled to the first circuit board and the voltage regulator can supply a regulated voltage to the one or more processors. The first circuit board (interposer) can include or use a Removeable Grid Array (RGA) board design described herein.

The first circuit board can be attached and conductively coupled to a second circuit board to provide communicative coupling between one or more devices attached to the first circuit board and one or more devices attached to the second circuit board. In some examples, the first circuit board can be connected by solder to the second circuit board. Instead of a socket connecting force, which can warp or damage a board and/or its devices connected thereto, connection by soldering can be used, which can potentially avoid board or device damage. The first circuit board can be removed and replaced with another circuit board with similar or different devices.

In some examples, the second circuit board can have a reduced thickness and/or reduced height motherboard design compared to motherboard designs to which processors are directly coupled. In some examples, a second voltage regulator can be attached and conductively coupled to the second circuit board and the second voltage regulator can supply a regulated voltage to one or more devices connected to the second circuit board. Memory devices (e.g., DIMMs) can be connected to a second side of the second circuit board where the second side of the second circuit board is opposite to that of a side that is attached to the first circuit board. In some cases, the assembly of the first circuit board connected to the second circuit board and their corresponding attached devices can fit within one rack unit (1 U) (e.g., 44.45 mm), although other thicknesses can be used such as any integer or decimal multiple of 1 U.

Board assemblies can provide a dense assembly of devices and allow use of short distance signal transmissions. Cables and optical interconnects may not be used to connect devices attached and connected to different boards. Cables and their connectors may have unacceptably high failure rates and require manual attachment, which can be time consuming and/or expensive. Attachment of the first circuit board to the second circuit board can increase device density and can reduce failures and simplify assembly, and reduce costs of device ownership and deployment. Parallel arrangements of multiple assemblies of first circuit board with second circuit board can be attached and conductively coupled, using orthogonal connectors described herein, to parallel arrangements of other multiple assemblies of first circuit board with second circuit board. For example, the configuration shown in FIG. 10A can be used attach different assemblies of a first circuit board to a second circuit board. As speed of reads from or writes to memory increase, shorter connection lengths can provide sufficiently high speed signal transfer with acceptable signal to noise ratio (SNR).

Example motherboards can connect one or more processors with one or more integrated circuits (IC) on opposite sides of a printed circuit board (PCB) or any substrate. An RGA board, if utilized, can be used to solder one or more CPUs to attach to and provide signal transfer and receipt to and from a motherboard to utilize both sides of a motherboard to be utilized. Stacking of substrates and attachment and connection can occur using a redistribution layer.

Figure 15A:
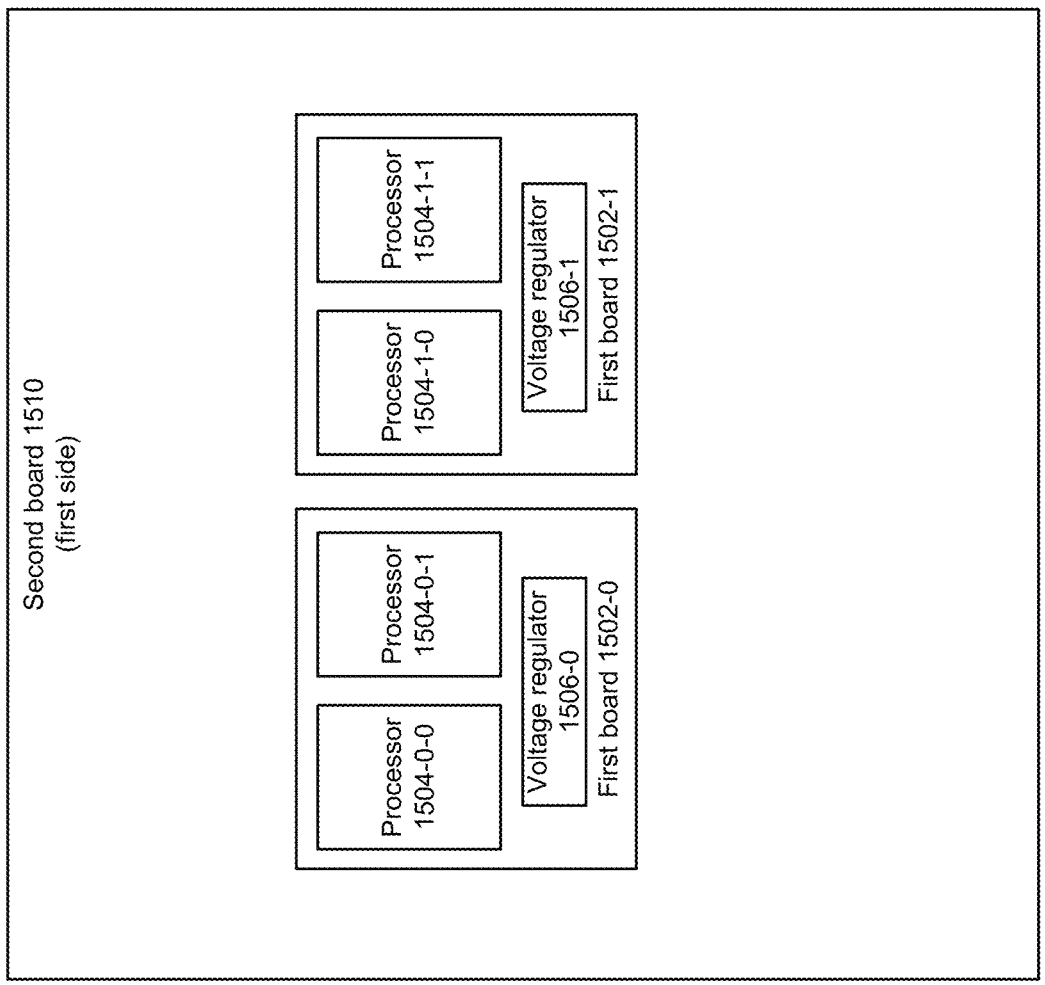
FIG. 15A depicts an example of an assembly of boards.

FIG. 15A depicts an example of an assembly of boards. First board 1502-0 can have processors 1504-0-0 and 1504-0-1 coupled thereto as well as voltage regulator 1506-0. Likewise, first board 1502-1 can have processors 1504-1-0 and 1504-1-1 coupled thereto as well as voltage regulator 1506-1. First boards 1502-0 and 1502-1 can be attached by solder and conductively coupled to a first side of second board 1510.

First board 1502-0 can provide an RGA board. An RGA board can be designed for low impedance power delivery that is isolated from a main motherboard. A voltage regulator (VR) for a CPU can be placed on first board 1502-0 and a VR for a second CPU can be placed on first board 1502-1. Voltage regulators can be placed closer to the CPUs and socket and retention mechanisms are not used or take space that could be used for other component. A VR can provide voltage dedicated to VCCP power output to the CPU(s). Dense packing of transistors, inductors, and capacitors can allow for greater power delivery. A VR positioned closer to a voltage receiver can translate into less power loss and ability to use thinner copper planes inside a board, which allows the board to be thinner. Using dedicating power delivery layers in first circuit boards 1502-0 and 1502-1 can allow for reduced resistance and a dense and capacitance which can improve power delivery.

First circuit boards 1502-0 and 1502-1 can provide a smaller PCB form factor than that of a motherboard (e.g., second board 1510). PCBs can be designed with one or more layers of copper separated by the layer of dielectric. PCBs can include multiple layers where a layer can include a layer of copper and a layer of dielectric. A motherboard can provide layers for power, signal, memory signal, and or interconnect signal routing and connected to first circuit boards 1502-0 and 1502-1. A separate VR attached to motherboard can provide voltage to motherboard specific devices.

A reduced thickness board can be cheaper (e.g., less materials) and use thinner copper wires. For example, without use of first circuit boards 1502-0 and 1502-1, a 20 layer motherboard (e.g., 6"×24") may be used but with use of first circuit boards 1502-0 and 1502-1, layers in first circuit boards 1502-0 and 1502-1 can be dedicated for purposes (e.g., power delivery), and reduce the number of layers in motherboard (and cost) by a much larger amount than the cost of first circuit boards 1502-0 and 1502-1. For example, a 20 layer motherboard may cost $320, while an 8 layer motherboard may cost $80, with first circuit boards 1502-0 and 1502-1 costing $30 each. Other numbers of first circuit boards can be used. Dedicating layers in first circuit boards to a specific components allows the motherboard to be potentially implemented with fewer layers and offload dedicated copper layers to the smaller RGA interposer (e.g., first circuit boards 1502-0 and 1502-1).

Figure 15B:
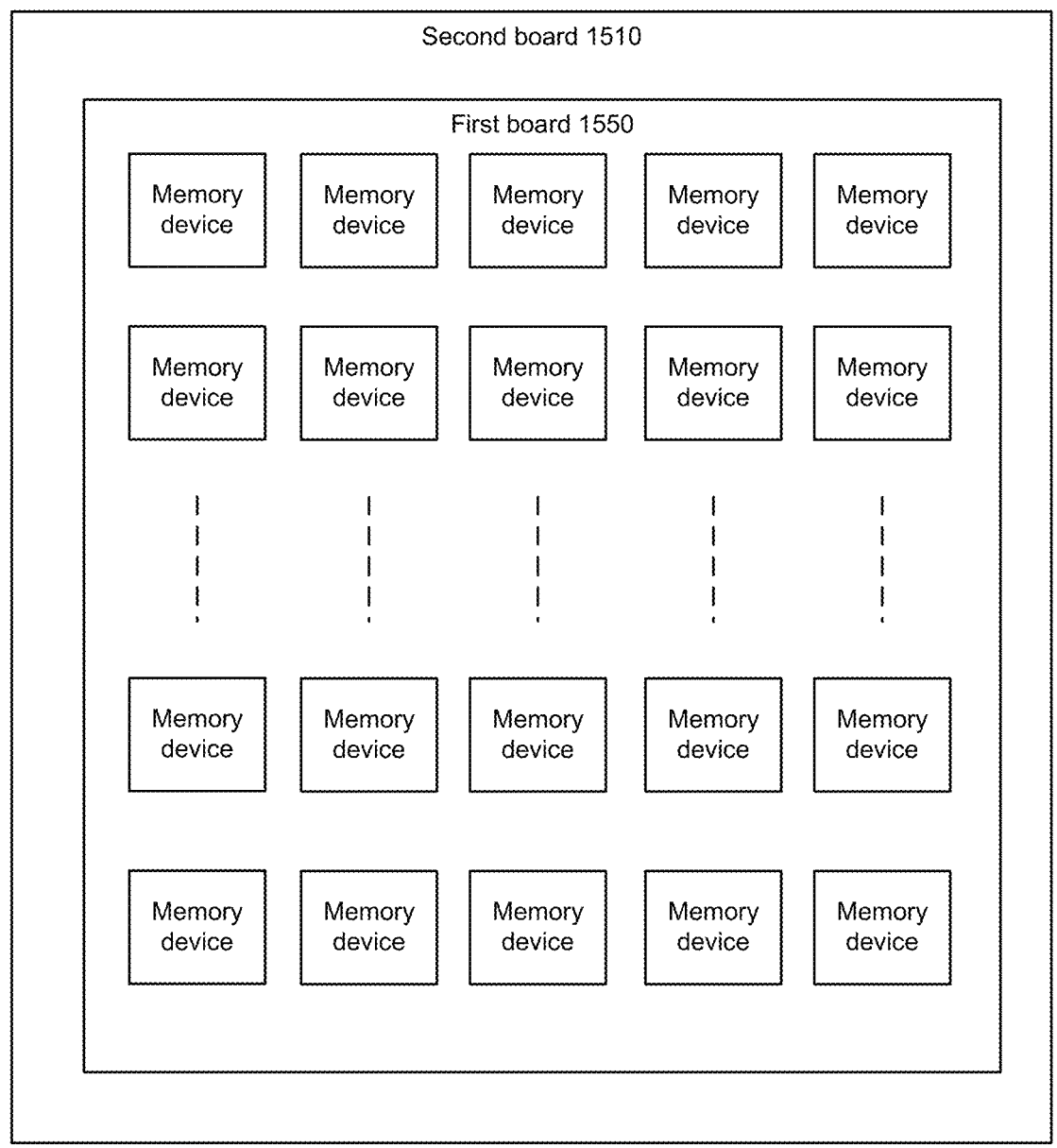
FIG. 15B depicts an example of a first circuit board used to connect to memory devices. Memory devices can be laid planar with respect to the first board.

FIG. 15B depicts an example of a first circuit board used to connect to memory devices. Memory devices can be laid planar with respect to the first board 1550. Devices on first board 1550 can be tested independent of attachment to second board 1510. After testing, this planar memory mezzanine can be attached to a first side of second board 1510 with processors attached to a second side of second board 1510 to provide electrically connected processors and memory devices to a motherboard. A dense arrangement of devices can enable access to local memory with a reduced signal routing distance. DIMM connectors may not be used and board integration failures can be avoided to reduce cost.

FIGS. 15C-1 and 15C-2 depict an example manner of connecting first circuit board to a second circuit board. RGA interposer 1560 on the MB 1570 with the CPU 1564 and companion chip 1566 can be attached interposer 1560 and embedded heaters 1562 within the RGA interposer 1560. RGA interposer 1560 can be soldered to the motherboard (MB) (or baseboard) 1570, such as in a BGA pattern (or lower BGA) 1576 corresponding to the connection pads at the bottom of the CPU package 1564. RGA interposer 1560 can include internal routing layers (or horizontal interconnect) 1568 for connecting signals between the CPU 1564 and the companion chip 1566 (e.g., between horizontally separated connection pads) without having to go through the baseboard 1570.

RGA interposer 1560 can be soldered to MB 1570 through a lower BGA 1576 connecting a corresponding array of lower connection pads on the bottom of the RGA interposer 1560 with an array of connection pads or contacts on the top of the MB 1570. Connection pads and solder BGA can correspond to the CPU 1564, so that communication from the MB to one or more components on the RGA interposer 1560 is routed through CPU 1564. CPU 1564 can be soldered to the RGA interposer 1560 through a first upper BGA (e.g., corresponding to a CPU socket) connecting a corresponding array of connection pads on the bottom of the CPU package 1564 with a first array of upper connection pads 1572 on the top of the RGA interposer 1560. Companion chip 1566 can be soldered to the RGA interposer 1560 through a second upper BGA 1574 connecting a corresponding array of connection pads (or BGA contacts) on the bottom of the companion chip package 1566 with a second array of upper connection pads 1572 on the top of the RGA interposer 1560.

Further, the RGA interposer 1560 can include a vertical interconnect 1578 (e.g., signal traces for carrying signals between vertically separated connection pads) to connect corresponding ones of the upper connection pads 1572 to ones of the lower connection pads. Components can be attached to the top of the RGA interposer 1560 using corresponding zones of the embedded heaters 1562 to heat the corresponding ones of the upper connection pads to solder reflow temperatures. Heaters 1562 can create heating zones that can be used to direct-attach (e.g., via solder or other suitable bonding agent) individual components to the RGA without disturbing the attachment of other components or packages previously populated on the RGA, MB, or computer system. The attached components can use upper connection pads 1572, vertical interconnect 1578, and lower connection pads to connect some, all, or none of the corresponding connection pads on the bottom of the CPU 1564 (or other component) to similar connection pads of the MB 1570 as if the CPU 1564 (or other component) was directly (or more directly) attached (e.g., through lower BGA 1576) to the MB 1570.

RGA interposer 1560 with a CPU 1564 and companion chip 1566 can be soldered to interposer 1560. Multiple configurations of components can be attached to the RGA 1560 in close proximity to the CPU die 1564, allowing a configurable multichip package. For example, RGA interposer 1560 could for multiple memory chips and multiple FPGA packages to be attached in close proximity to the CPU 1564. A number of memory chips and FPGA packages to solder on RGA interposer 1560 can be changed. Malfunctioning components such as faulty processors or memory chips could be individually repaired, replaced, or removed without disturbing the rest of the RGA interposer 1560, the MB 1570, or other components.

Figure 15D:
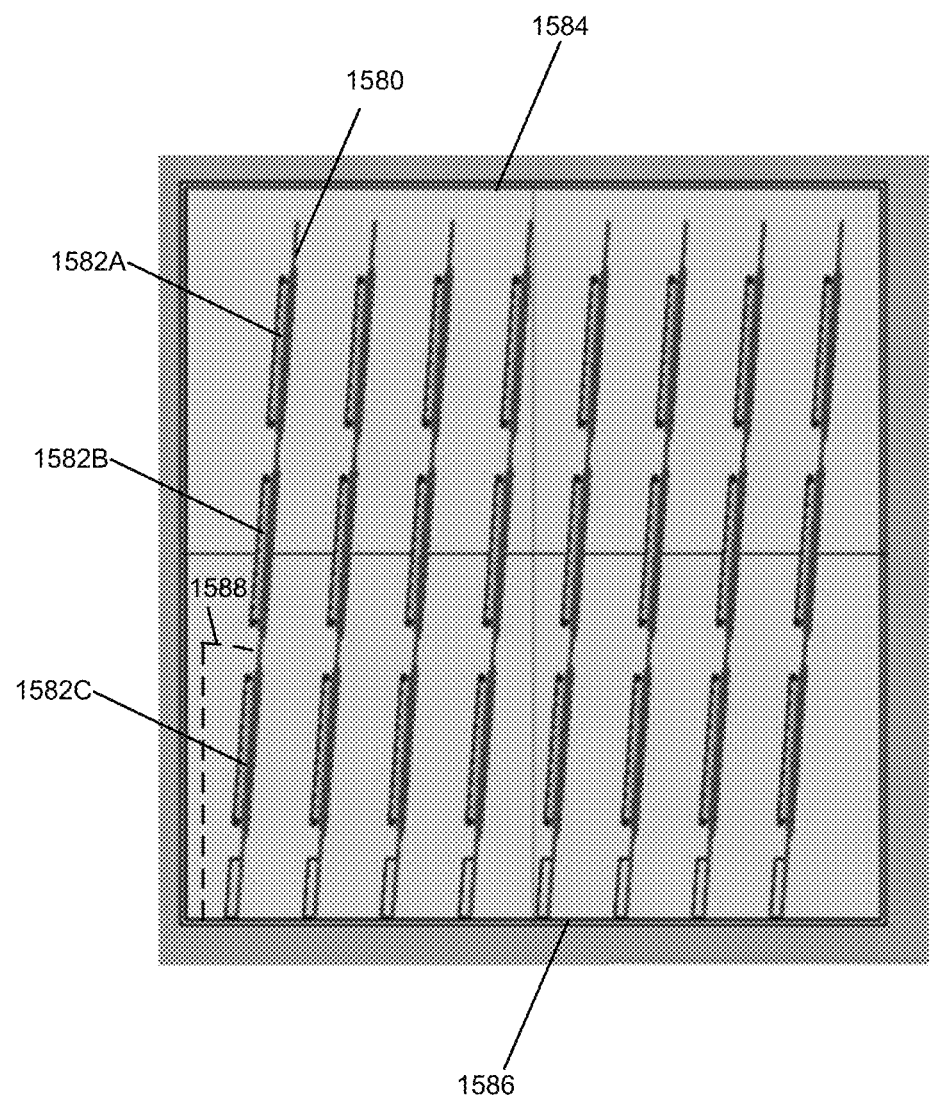
FIG. 15D depicts an example of arrangement of boards in a two phase liquid cooling system.

FIG. 15D depicts an example of arrangement of boards in a two-phase liquid cooling system. Boards 1580 placed in parallel in a liquid or cooling plate environment within tank 1584 can improve compute density and enable memory pooling (e.g., sharing of a memory pool by several processor subsystems connected to multiple different motherboards). Using thinner boards 1580 can increase density of devices placed in a liquid cooling environment within tank 1584 and use less cooling fluid to cool more devices. For example, 3-4× increased density of power per square foot increase can be obtained using thinner boards 1580 with processors 1582A-C on one side of a board and memory on the opposite side. The memory connected to an opposite side of the board to which the processors 1582 are connected is so thin at this scale, it is not visible. In some examples, an angle 1588 of board 1580 relative to side 1586 can be less than 90 degrees so that devices on board 1580 can be less exposed to gas (e.g., bubble field) emitted from other devices and increase cooling of such devices. For example, heat emitted from processor 1582C can cause transformation of fluid to gas that does not contact processor 1582B or processor 1582A and can allow processor 1582A and 1582B to be cooled by contact with fluid and contact with a bubble field from processor 1582C can be reduced. Likewise, because of angle 1588, a bubble field emitted caused by boiling of fluid from contact with processor 1582B may not contact processor 1582A or at least contact with processor 1582A can be reduced. Although processors 1582A-C are provided as examples, any devices can be used instead of or in addition to processors.

In some examples, DIMM connectors on a side of board 1580 and angled at 90 degrees relative to the board or other angles. Because the RGA allows for implementation of the board without socket and backing plate, some examples include memory devices to be positioned directly under the CPUs connected to board 1580.

RGA Shoot Through Examples

Figure 16A:
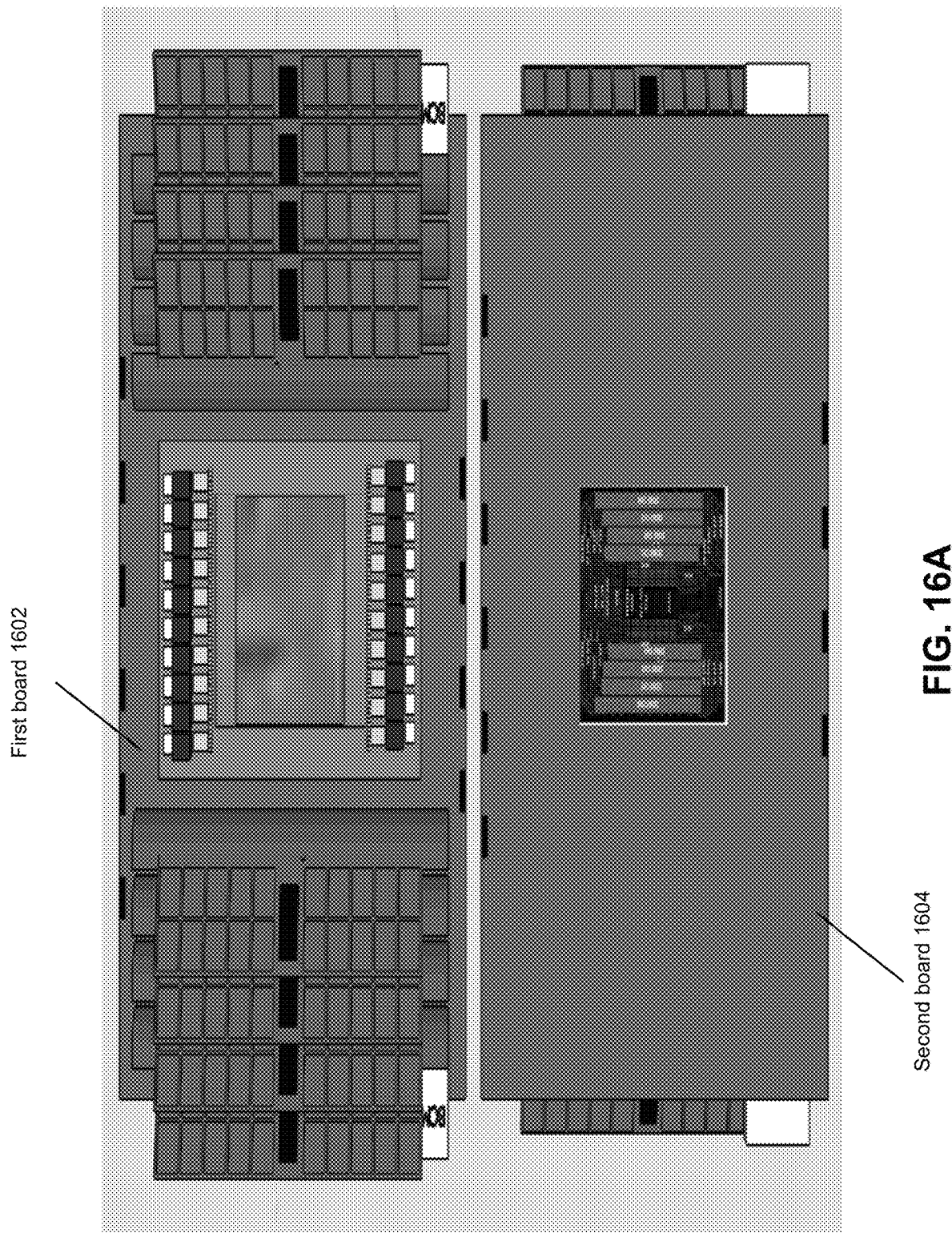
FIG. 16A depicts an example of a single CPU with its memories attached and communicatively coupled to a circuit board.

FIG. 16A depicts an example of a single CPU with its memories attached and communicatively coupled to a circuit board. Second circuit board 1604 is placed directly behind or underneath the circuit board, where the second board can be a same or larger size as that of the circuit board. When the two boards are placed directly on top of each other the plated through the vias from one board may attach to and form electrical connections with the other board. By using RGA connection 1610 to interconnect boards 1602 and 1604 with a redistribution layer, the communication buses between the two processors can be interconnected and a two CPU socket subsystem can be formed. Additionally, the communication bus signal lengths can be relatively short and allow for high speed communications.

Figure 16B:
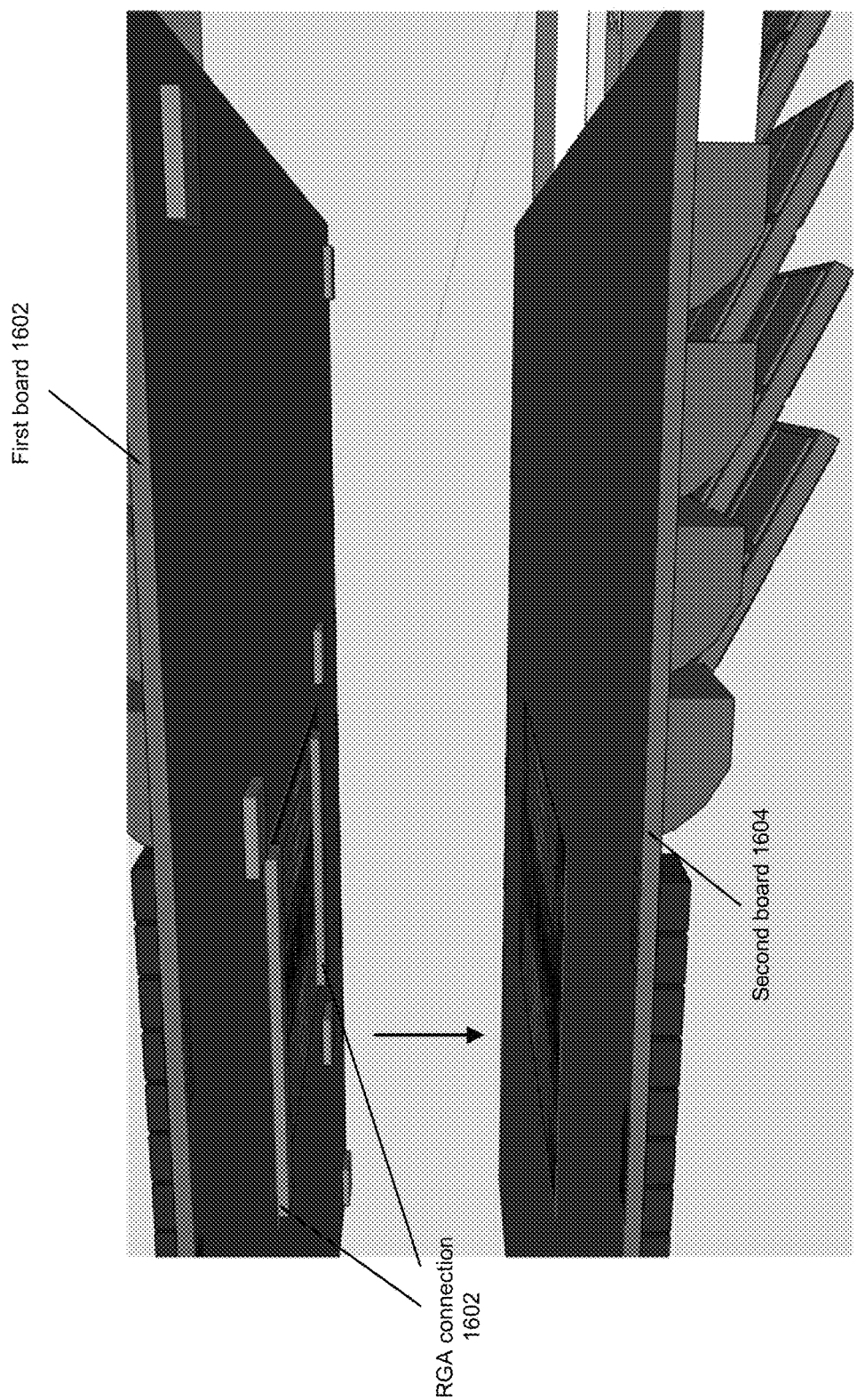
FIG. 16B shows a closeup image from the two boards as they are being brought together for assembly.

FIG. 16B shows a closeup image from the two boards as they are being brought together for assembly into a two CPU socket (2S) system using RGA connection. Besides providing mechanical and electrical interconnection of the boards 1602 and 1604, RGA technologies provide a redistribution layer to provide for proper signal interconnects between the two boards. Soldering can be performed to attach and communicatively couple boards 1602 and 1604.

Figure 17:
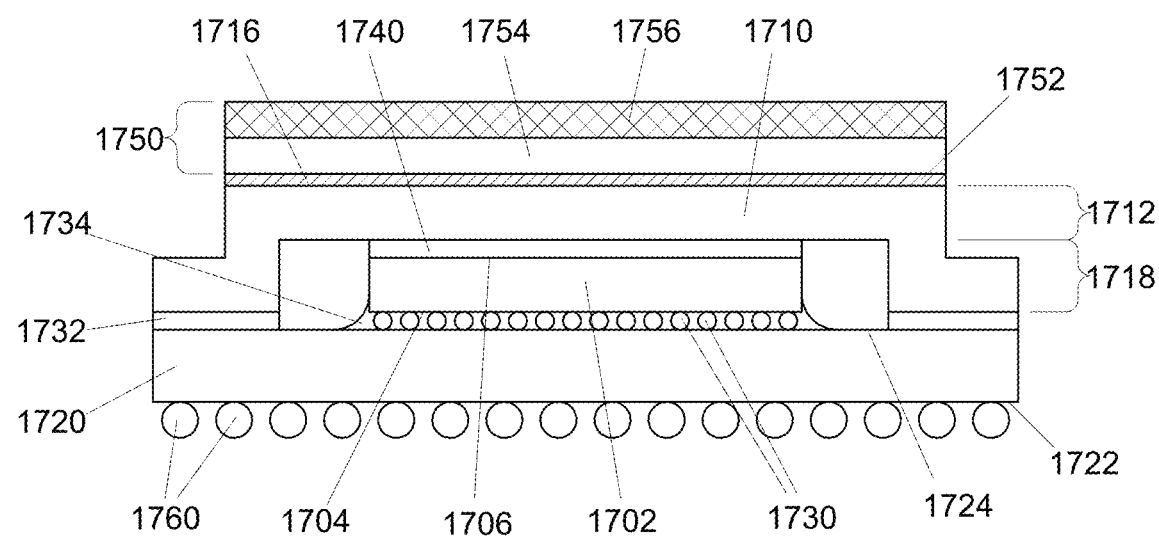
FIG. 17 depicts an example of use of a boiling enhancement structure to remove heat from a device for use in a 2PILC system.

FIG. 17 depicts an example of use of a boiling enhancement structure to remove heat from a device for use in a 2PILC system. The at least one integrated circuit package may be electrically attached to an electronic substrate in a configuration generally known as a flip-chip or controlled collapse chip connection ("C4") configuration. The integrated circuit package may comprise a package substrate or interposer 1720 with a first surface 1722 and an opposing second surface 1724, and an integrated circuit device 1702 electrically attached proximate the second surface 1724 of the package interposer 1720. Package interposer 1720 may be attached to the electronic substrate or board with the plurality of package-to-substrate interconnects 1760. The package-to-substrate interconnects 1760 may extend between bond pads (not shown) proximate a first surface of the electronic substrate and bond pads (not shown) proximate the first surface 1722 of the package interposer 1720.

The package interposer 1720 may comprise any of the materials and/or structure as discussed previously with regard to the electronic substrate. The package interposer 1720 may further include conductive routes or "metallization" (not shown) extending through the package interposer 1720, which may comprise any of the materials and/or structures as discussed previously with regard to the conductive routes of the electronic substrate. The bond pads (not shown) proximate the first surface 1722 of the package interposer 1720 may be in electrical contact with the conductive routes, and the conductive routes may extend through the package interposer 1720 and be electrically connected to bond pads (not shown) proximate the second surface 1724 of the package substrate 1720. As will be understood to those skilled in the art, the package interposer 1720 may be a cored substrate or a coreless substrate.

The integrated circuit device 1702 may be any appropriate device, including, but not limited to, a microprocessor, a chipset, a graphics device, a wireless device, a memory device, an application specific integrated circuit, a transceiver device, an input/output device, combinations thereof, stacks thereof, or the like. Integrated circuit device 1702 may each have a first surface 1704 and an opposing second surface 1706.

Integrated circuit device 1702 may be electrically attached to the package interposer 1720 with a plurality of device-to-substrate interconnects 1730. Device-to-substrate interconnects 1730 may extend between bond pads (not shown) on the first surface 1722 of the package interposer 1720 and bond pads (not shown) on the first surface 1704 of the integrated circuit device 1702. The device-to-substrate interconnects 1730 may be any appropriate electrically conductive material or structure, including, but not limited to, solder balls, metal bumps or pillars, metal filled epoxies, or a combination thereof. Device-to-substrate interconnects 1730 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). Device-to-substrate interconnects 1730 may be copper bumps or pillars. Device-to-substrate interconnects 1730 may be metal bumps or pillars coated with a solder material.

The device-to-substrate interconnects 1730 may be in electrical communication with integrated circuitry (not shown) within the integrated circuit device 1702 and may be in electrical contact with the conductive routes. The conductive routes may extend through the package interposer 1720 and be electrically connected to package-to-board interconnects 1760. As will be understood to those skilled in the art, the package interposer 1720 may reroute a fine pitch (center-to-center distance) of the device-to-interposer interconnects 1730 to a relatively wider pitch of the package-to-substrate interconnects 1760. The package-to-substrate interconnects 1760 may be any appropriate electrically conductive material, including, but not limited to, metal filled epoxies and solders, such as tin, lead/tin alloys (e.g., 63% tin/37% lead solder), and high tin content alloys (e.g., 90% or more tin—such as tin/bismuth, eutectic tin/silver, ternary tin/silver/copper, eutectic tin/copper, and similar alloys).

Integrated circuit package may further include a heat dissipation device 1710, such as an integrated heat spreader, that may be thermally coupled with the second surface 1706 of the integrated circuit device 1702 with a first thermal interface material 1740. The heat dissipation device 1710 may comprise a main body 1712, having a first surface 1714 and an opposing second surface 1716, and at least one boundary wall 1718 extending from the first surface 1714 of the main body 1712 of the heat dissipation device 1710. The at least one boundary wall 1718 may be attached or sealed to the first surface 1722 of the package interposer 1720 with the attachment adhesive or sealant layer 1732.

The heat dissipation device 1710 may be made of any appropriate thermally conductive material, including, but not limited to, at least one metal material and alloys of more than one metal, or highly doped glass or highly conductive ceramic material, such as aluminum nitride. Heat dissipation device 1710 may comprise copper, nickel, aluminum, alloys thereof, laminated metals including coated materials (such as nickel coated copper), and the like. The first thermal interface material 1740 may be any appropriate, thermally conductive material, including, but not limited to, a thermal grease, a thermal gap pad, a polymer, an epoxy filled with high thermal conductivity fillers, such as metal particles or silicon particles, and the like.

Heat dissipation device 1710 may be a single material throughout, such as when the heat dissipation device 1710 including the heat dissipation device boundary wall 1718 is formed by a single operation, including but not limited to, stamping, skiving, molding, and the like. However, heat dissipation device 1710 can be made of more than one component. For example, the heat dissipation device boundary wall 1718 may be formed separately from the main body 1712, then attached together to form the heat dissipation device 1710. Boundary wall 1718 may surround the integrated circuit device 1702.

Attachment adhesive 1732 may be any appropriate material, including, but not limited to, silicones (such as polydimethylsiloxane), epoxies, and the like. Boundary wall 1718 may not only secure the heat dissipation device 1710 to the package interposer 1720, but also helps to maintain a desired distance (e.g., bond line thickness) between the first surface 1714 of the heat dissipation device 1710 and second surface 1706 of the integrated circuit device 1702.

Prior to the attachment of the heat dissipation device 1710, an electrically-insulating underfill material 1734 may be disposed between the integrated circuit device 1702 and the package interposer 1720, which substantially encapsulates the device-to-interposer interconnects 1730. The underfill material 1734 may be used to reduce mechanical stress issues that can arise from thermal expansion mismatch between the package interposer 1720 and the integrated circuit device 1702. The underfill material 1734 may be an epoxy material, including, but not limited to epoxy, cyanoester, silicone, siloxane and phenolic based resins, that has sufficiently low viscosity to be wicked between the integrated circuit device 1702 and the package interposer 1720 by capillary action when introduced by an underfill material dispenser (not shown), which will be understood to those skilled in the art. The underfill material 1734 may be subsequently cured (hardened), such as by heat or radiation.

Boiling enhancement structure 1750 may comprise a thermally conductive film 1754 having a sintered metal powder layer 1756 thereon, wherein the thermally conductive film 1754 is attached to the second surface 1716 of the main body 1712 of the heat dissipation device 1710 with the thermally conductive adhesive 1752. Thermally conductive film 1754 and the sintered metal powder layer 1756 may comprise copper.

Thermally conductive adhesive 1752 may be a solder material, such as an indium/tin alloy solder. Thermally conductive adhesive 1752 may be high thermally conductivity polymer, such as a silver filled epoxy (i.e. an epoxy material with silver particular dispersed therein). One process for attaching the boiling enhancement structure 1750 may comprise forming the thermally conductive adhesive 1752 on the second surface 1716 of the main body 1712 of the heat dissipation device 1710, such as by screen-printing, dispensing, and the like. The boiling enhancement structure 1750 may then be aligned on the thermally conductive adhesive 1752 and subjected to a thermal compression bonding process, as will be understood to those skilled in the art.

Example System

Figure 18:
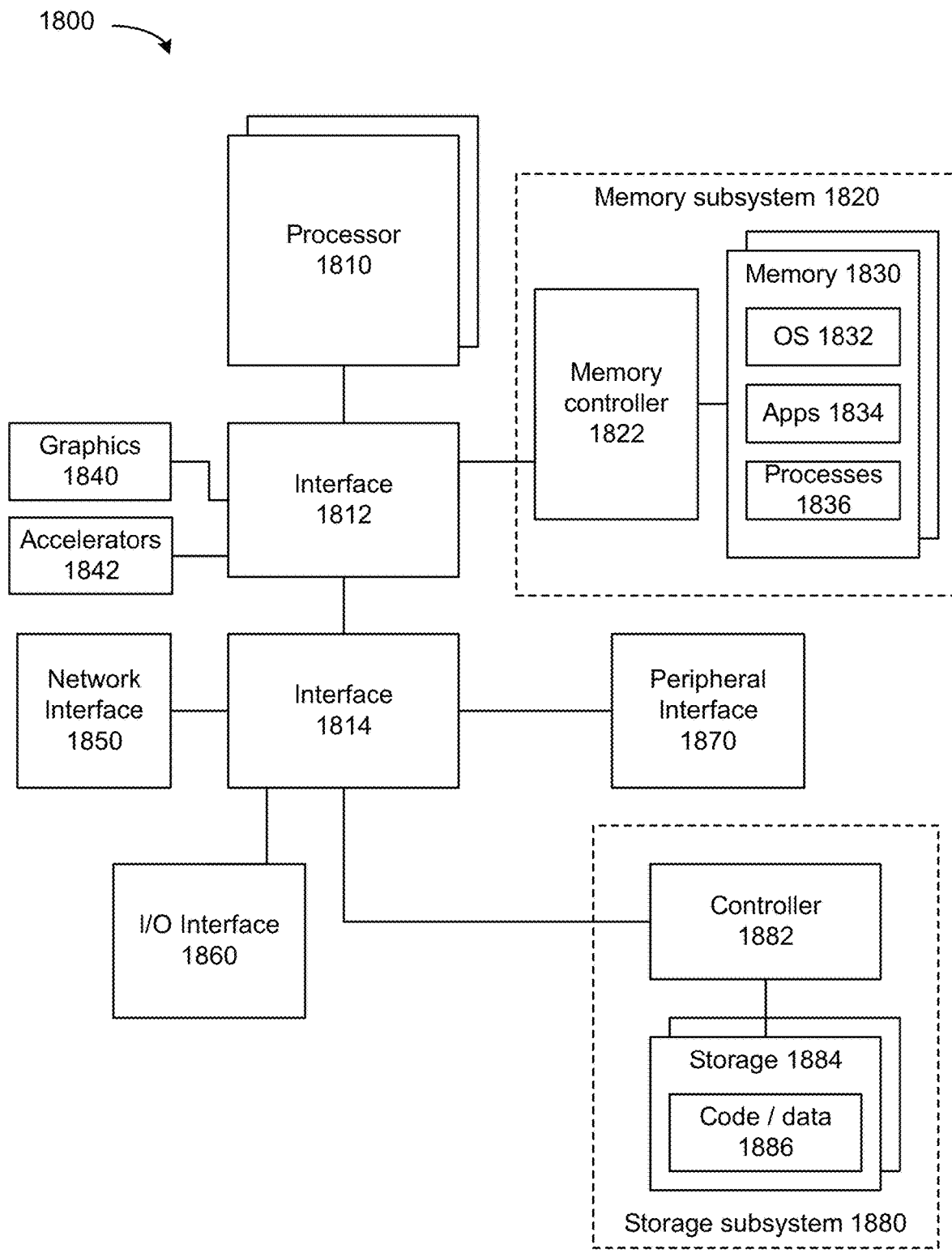
FIG. 18 depicts an example computing system.

FIG. 18 depicts an example computing system. One or more components of system 1800 can utilize one or more of: circuit board technology described herein, connection technology described herein, and/or liquid cooling technology described herein. System 1800 includes processor 1810, which provides processing, operation management, and execution of instructions for system 1800. Processor 1810 can include any type of microprocessor, central processing unit (CPU), graphics processing unit (GPU), vision processing unit (VPU), processing core, or other processing hardware to provide processing for system 1800, or a combination of processors. Processor 1810 controls the overall operation of system 1800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 1800 includes interface 1812 coupled to processor 1810, which can represent a higher speed interface or a high throughput interface for system components that needs higher bandwidth connections, such as memory subsystem 1820 or graphics interface components 1840, or accelerators 1842. Interface 1812 represents an interface circuit, which can be a standalone component or integrated onto a processor die. Where present, graphics interface 1840 interfaces to graphics components for providing a visual display to a user of system 1800. In one example, graphics interface 1840 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 1840 generates a display based on data stored in memory 1830 or based on operations executed by processor 1810 or both. In one example, graphics interface 1840 generates a display based on data stored in memory 1830 or based on operations executed by processor 1810 or both.

Accelerators 1842 can be a fixed function or programmable offload engine that can be accessed or used by a processor 1810. For example, an accelerator among accelerators 1842 can provide compression (DC) capability, cryptography services such as public key encryption (PKE), cipher, hash/authentication capabilities, decryption, or other capabilities or services. In addition or alternatively, an accelerator among accelerators 1842 provides field select controller capabilities as described herein. In some cases, accelerators 1842 can be integrated into a CPU socket (e.g., a connector to a motherboard or circuit board that includes a CPU and provides an electrical interface with the CPU). For example, accelerators 1842 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs) or programmable logic devices (PLDs). Accelerators 1842 can provide multiple neural networks, CPUs, processor cores, general purpose graphics processing units, or graphics processing units can be made available for use by artificial intelligence (AI) or machine learning (ML) models. For example, the AI model can use or include one or more of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 1820 represents the main memory of system 1800 and provides storage for code to be executed by processor 1810, or data values to be used in executing a routine. Memory subsystem 1820 can include one or more memory devices 1830 such as read-only memory (ROM), flash memory, one or more varieties of random access memory (RAM) such as DRAM, or other memory devices, or a combination of such devices. Memory 1830 stores and hosts, among other things, operating system (OS) 1832 to provide a software platform for execution of instructions in system 1800. Additionally, applications 1834 can execute on the software platform of OS 1832 from memory 1830. Applications 1834 represent programs that have their own operational logic to perform execution of one or more functions. Processes 1836 represent agents or routines that provide auxiliary functions to OS 1832 or one or more applications 1834 or a combination. OS 1832, applications 1834, and processes 1836 provide software logic to provide functions for system 1800. In one example, memory subsystem 1820 includes memory controller 1822, which is a memory controller to generate and issue commands to memory 1830. It will be understood that memory controller 1822 could be a physical part of processor 1810 or a physical part of interface 1812. For example, memory controller 1822 can be an integrated memory controller, integrated onto a circuit with processor 1810.

In some examples, OS 1832 can be Linux®, Windows® Server or personal computer, FreeBSD®, Android®, MacOS®, iOS®, VMware vSphere, openSUSE, RHEL, CentOS, Debian, Ubuntu, or any other operating system. The OS and driver can execute on a processor that is sold by, designed by, or consistent with designs from, among others, Intel®, ARM®, AMD®, Qualcomm®, IBM®, Texas Instruments®, Tensilica, Argonaut reduced instruction set computer (RISC) Core (ARC), or RISC-V.

While not specifically illustrated, it will be understood that system 1800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 1800 includes interface 1814, which can be coupled to interface 1812. In one example, interface 1814 represents an interface circuit, which can include standalone components and integrated circuitry. In one example, multiple user interface components or peripheral components, or both, couple to interface 1814. Network interface 1850 provides system 1800 the ability to communicate with remote devices (e.g., servers or other computing devices) over one or more networks. Network interface 1850 can include an Ethernet adapter, wireless interconnection components, cellular network interconnection components, USB (universal serial bus), or other wired or wireless standards-based or proprietary interfaces. Network interface 1850 can transmit data to a device that is in the same data center or rack or a remote device, which can include sending data stored in memory. Network interface 1850 can receive data from a remote device, which can include storing received data into memory.

Some examples of network interface 1850 are part of an Infrastructure Processing Unit (IPU) or data processing unit (DPU) or utilized by an IPU or DPU. An IPU or DPU can include a network interface, memory devices, and one or more programmable or fixed function processors (e.g., CPU or XPU) to perform offload of operations that could have been performed by a host CPU, GPU, GPGPU, or XPU or remote CPU or XPU. In some examples, the IPU or DPU can perform virtual switch operations, manage storage transactions (e.g., compression, cryptography, virtualization), and manage operations performed on other IPUs, DPUs, servers, or devices.

In one example, system 1800 includes one or more input/output (I/O) interface(s) 1860. I/O interface 1860 can include one or more interface components through which a user interacts with system 1800 (e.g., audio, alphanumeric, tactile/touch, or other interfacing). Peripheral interface 1870 can include any hardware interface not specifically mentioned above. Peripherals refer generally to devices that connect dependently to system 1800. A dependent connection is one where system 1800 provides the software platform or hardware platform or both on which operation executes, and with which a user interacts.

In one example, system 1800 includes storage subsystem 1880 to store data in a nonvolatile manner. In one example, in certain system implementations, at least certain components of storage 1880 can overlap with components of memory subsystem 1820. Storage subsystem 1880 includes storage device(s) 1884, which can be or include any conventional medium for storing large amounts of data in a nonvolatile manner, such as one or more magnetic, solid state, or optical based disks, or a combination. Storage 1884 holds code or instructions and data 1886 in a persistent state (e.g., the value is retained despite interruption of power to system 1800). Storage 1884 can be generically considered to be a "memory," although memory 1830 is typically the executing or operating memory to provide instructions to processor 1810. Whereas storage 1884 is nonvolatile, memory 1830 can include volatile memory (e.g., the value or state of the data is indeterminate if power is interrupted to system 1800). In one example, storage subsystem 1880 includes controller 1882 to interface with storage 1884. In one example controller 1882 is a physical part of interface 1814 or processor 1810 or can include circuits or logic in both processor 1810 and interface 1814.

A volatile memory is memory whose state (and therefore the data stored in it) is indeterminate if power is interrupted to the device. Dynamic volatile memory uses refreshing the data stored in the device to maintain state. One example of dynamic volatile memory includes DRAM (Dynamic Random Access Memory), or some variant such as Synchronous DRAM (SDRAM). An example of a volatile memory includes a cache. A memory subsystem as described herein may be compatible with a number of memory technologies, such as DDR3 (Double Data Rate version 3, original release by JEDEC (Joint Electronic Device Engineering Council) on Jun. 16, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications.

A non-volatile memory (NVM) device is a memory whose state is determinate even if power is interrupted to the device. The NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), Intel® Optane™ memory, NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of one or more of the above, or other memory.

A power source (not depicted) provides power to the components of system 1800. More specifically, power source typically interfaces to one or multiple power supplies in system 1800 to provide power to the components of system 1800. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 1800 can be implemented using interconnected compute sleds of processors, memories, storages, network interfaces, and other components. High speed interconnects can be used such as: Ethernet (IEEE 802.3), remote direct memory access (RDMA), InfiniBand, Internet Wide Area RDMA Protocol (iWARP), Transmission Control Protocol (TCP), User Datagram Protocol (UDP), quick UDP Internet Connections (QUIC), RDMA over Converged Ethernet (RoCE), Peripheral Component Interconnect express (PCIe), Intel QuickPath Interconnect (QPI), Intel Ultra Path Interconnect (UPI), Intel On-Chip System Fabric (IOSF), Omni-Path, Compute Express Link (CXL), HyperTransport, high-speed fabric, NVLink, Advanced Microcontroller Bus Architecture (AMBA) interconnect, OpenCAPI, Gen-Z, Infinity Fabric (IF), Cache Coherent Interconnect for Accelerators (CCIX), 3GPP Long Term Evolution (LTE) (4G), 3GPP 5G, and variations thereof. Data can be copied or stored to virtualized storage nodes or accessed using a protocol such as NVMe over Fabrics (NVMe-oF) or NVMe.

Examples herein can be part of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, a blade can include components common to conventional servers, including a main printed circuit board (main board) providing internal wiring (e.g., buses) for coupling appropriate integrated circuits (ICs) and other components mounted to the board.

In some examples, network interface and other examples described herein can be used in connection with a base station (e.g., 3G, 4G, 5G and so forth), macro base station (e.g., 5G networks), picostation (e.g., an IEEE 802.11 compatible access point), nanostation (e.g., for Point-to-Multi-Point (PtMP) applications), on-premises data centers, off-premises data centers, edge network elements, edge servers, edge switches, fog network elements, and/or hybrid data centers (e.g., data center that use virtualization, cloud and software-defined networking to deliver application workloads across physical data centers and distributed multi-cloud environments).

Example Processes

Figure 19:
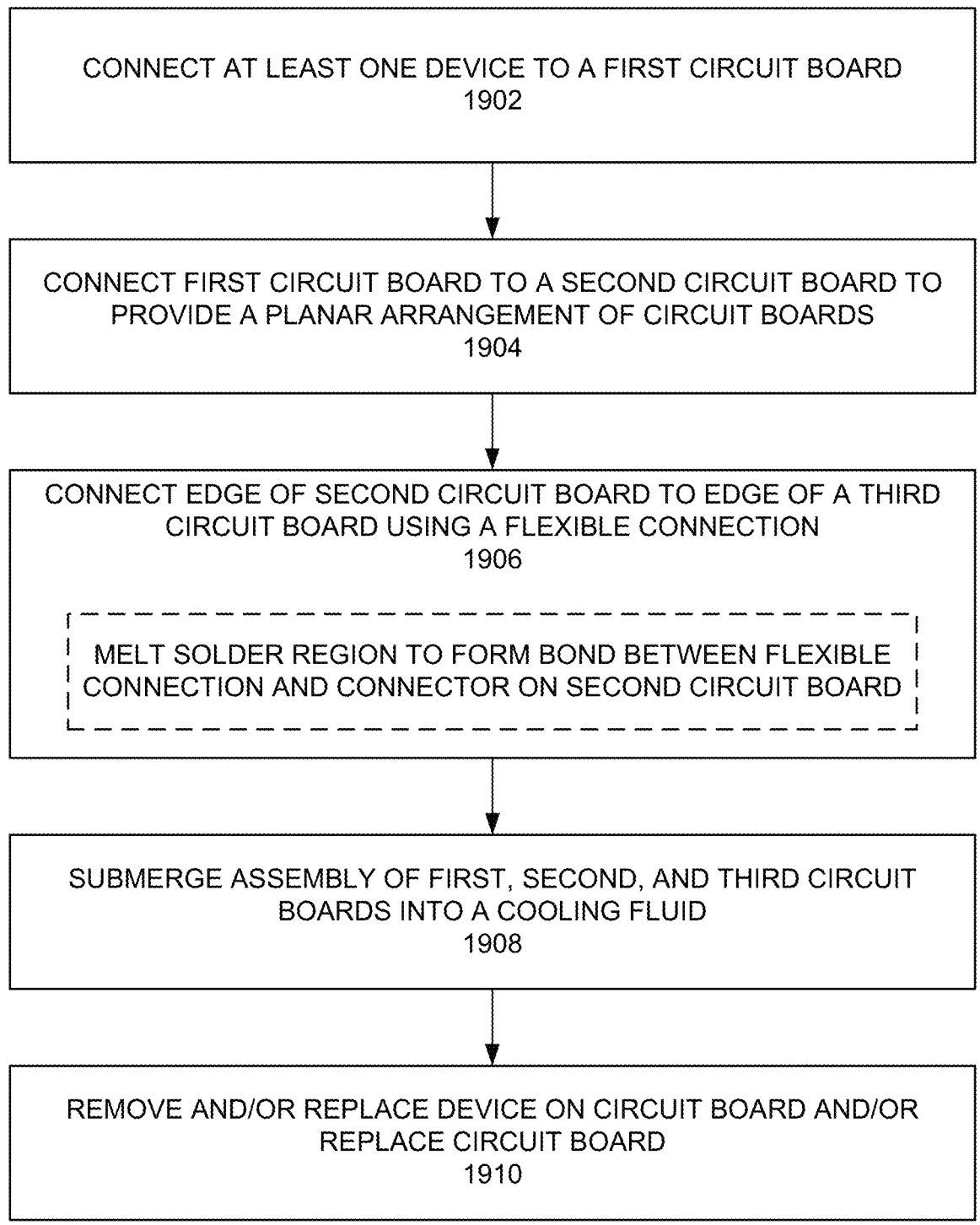
FIG. 19 depicts an example process.

FIG. 19 depicts an example process to form a system using one or more circuit boards and connections described herein. At 1902, at least one device can be attached and conductively coupled to a first circuit board. In some examples, the at least one device coupled to the first circuit board can include one or more of: a processor, memory device, accelerator, FPGA, storage device, network interface, switch and so forth. At 1904, the first circuit board can be attached to a second circuit board so that the first circuit board are approximately parallel. For example, soldering can be performed to provide conductive coupling and attachment of conductors of the first circuit board to conductors of the second circuit board. At 1906, an edge of the second circuit board can be oriented approximately orthogonal to an edge of a third circuit board. At least one device can be coupled to the third circuit board and the at least one device can be coupled to the third circuit board can include one or more of: a processor, memory device, accelerator, FPGA, storage device, network interface, switch and so forth. At 1906, a connection between the second circuit board and the third circuit board using flexible connectors. For example, flexible connectors can be bonded to conductors of the first circuit board by causing a current flow through traces of the first circuit board to partially melt a solder region on the first circuit board and the melted solder region in contact with flexible connectors can form a physical bond. For example, flexible connectors can be bonded to conductors of the second circuit board by causing a current flow through traces of the second circuit board to partially melt a solder region and the melted solder region in contact with flexible connectors can form a physical bond.

At 1908, the first, second, and third circuit boards can be fully or at least partially submerged into a tank of fluid and cooled using two phase immersion liquid cooling (2PILC). In some examples, the fluid comprises one or more of: a liquid dielectric, mineral oil, non-conductive liquid, and/or non-corrosive liquid.

At 1910, the first, second, or third circuit boards can be removed and/or replaced. The assembly of first, second, and third circuit boards can be removed from the tank. For example, if a circuit board is to be removed, the flexible connector can be disconnected from that circuit board by heating of traces to partially melt or liquefy a solder region on that circuit board and the flexible connector can be removed. A device on that circuit board can be removed and replaced with another device. The removed or replaced device can be defective or otherwise replaced with a higher performing device. The process can return to 1902 to affix the device to the relevant circuit board such as the first, second, or third circuit board, and attach the circuit board to one or more other circuit boards as described herein.

Figure 20:
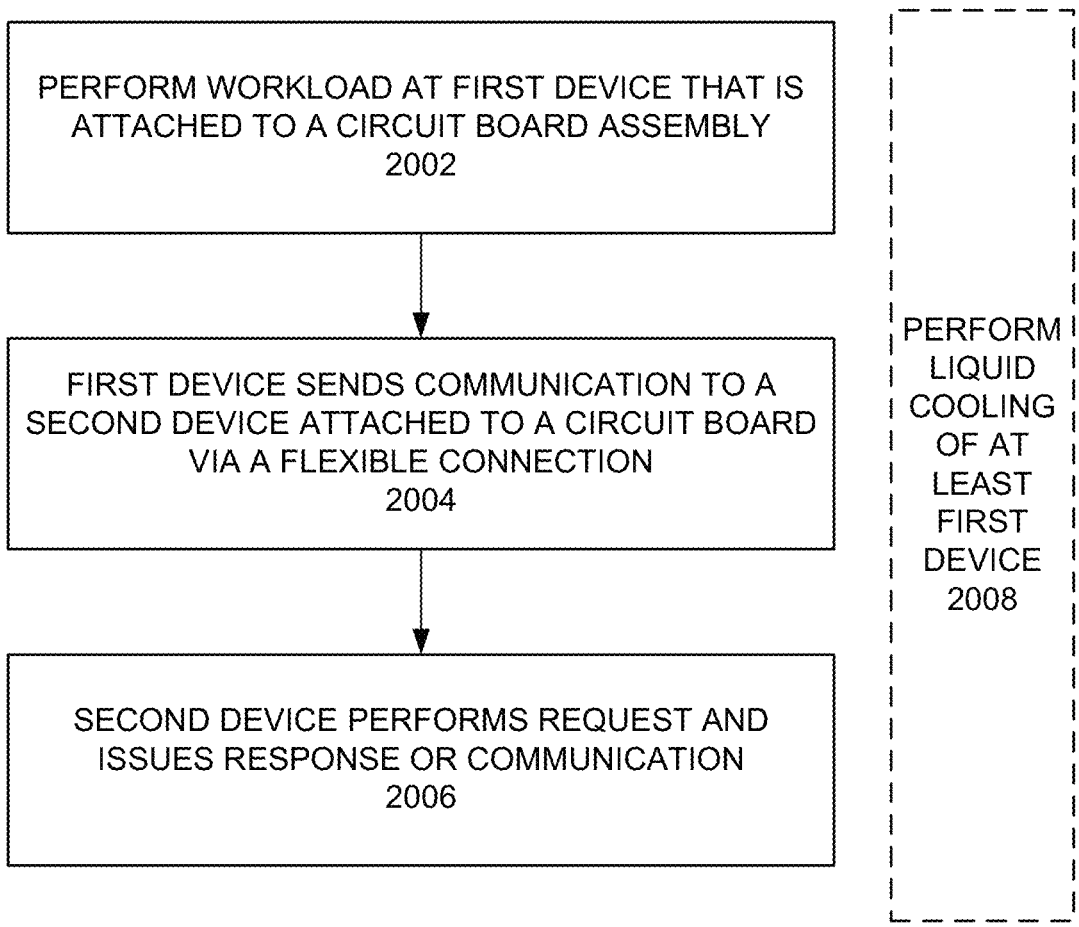
FIG. 20 depicts an example process.

FIG. 20 depicts an example process. The process can be performed by devices coupled to circuit boards formed in a manner described herein. At 2002, a first device can perform a workload. For example, a workload can include one or more of: processor executable code sequence, an application, microservice, service function chain (SFC), processing of received packets, packet transmission, data storage, data retrieval, and so forth. In some examples, the first device includes an arrangement of devices, circuit boards, and circuit board-to-circuit board connections described herein. For example, the first device can be attached to a first circuit board, the first circuit board can be attached to a second circuit board to provide a parallel orientation of the first circuit board to the second circuit board. In some examples, the first device includes one or more of: a processor, memory device, accelerator, FPGA, storage device, network interface, switch and so forth.

At 2004, the first device can send a communication to a second device via a flexible connector. The second device can be attached to a third circuit board and an edge of the second circuit board can be conductively coupled to an edge of the third circuit board using a flexible connector, where the edge of the second circuit board is oriented approximately 90 degrees to the edge of the third circuit board. In some examples, the second device includes one or more of: a processor, memory device, accelerator, FPGA, storage device, network interface, switch and so forth.

At 2006, the second device can perform the request. The second device can provide a response to the first device through the flexible connector or communicate with a third device using the flexible connector or other communication media. In some examples, the third device includes one or more of: a processor, memory device, accelerator, FPGA, storage device, network interface, switch and so forth. The third device can be positioned in the same tank as that of the first and device devices or different tank or outside of the tank.

At 2008, which can occur at a fully or partially overlapping time with one or more of 2002, 2004 and/or 2006, the first device can be cooled using two phase immersion liquid cooling (2PILC). For example, the first device can be at least partially submerged into a tank of fluid. The tank can be formed of one or more of: steel and acrylic. The fluid can be one or more of: a liquid dielectric, mineral oil, non-conductive liquid, and/or non-corrosive liquid.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of operations may also be performed according to alternatives. Furthermore, additional operations may be added or removed depending on the particular applications. Any combination of changes can be used and one of ordinary skill in the art with the benefit of this disclosure would understand the many variations, modifications, and alternatives thereof.

Disjunctive language such as the phrase "at least one of X, Y, or Z," unless specifically stated otherwise, is otherwise understood within the context as used in general to present that an item, term, etc., may be either X, Y, or Z, or combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or combination thereof, including "X, Y, and/or Z.'"

Illustrative examples of the devices, systems, and methods disclosed herein are provided below. An embodiment of the devices, systems, and methods may include one or more, and combination of, the examples described below.

A first processing of data in a multi-level neural network (NN), where performing the first processing of data includes generating meta-data indicative of an amount of processing for a second processing of the data in the multi-level NN; select one or more hardware resources for performance of the second processing of the data; and perform, by the selected one or more hardware resources, the second processing of the data in the multi-level NN, wherein one or more hardware resources utilized by the second processing is different than one or more hardware resources utilized by the first processing.

An example includes an apparatus comprising: a first motherboard with a recess region and a structure with one or more conductors and a second motherboard with a recess region and a structure with one or more conductors, wherein: when the recess region of the first motherboard is inserted into the recess region of the second motherboard, conductors of the structure with one or more conductors of the first motherboard align with conductors of the structure with one or more conductors of the second motherboard.

An example includes one or more other examples, wherein melting of a conductor is to cause a conductive coupling of conductors of structures of the first and second circuit motherboards.

An example includes one or more other examples, wherein the structure with one or more conductors of the first motherboard is coupled to the structure with one or more conductors of the second motherboard by soldering of conductors of the structure with one or more conductors of the first motherboard to conductors of the second motherboard.

An example includes one or more other examples, wherein the structure with one or more conductors of the first motherboard comprises a first circuit board coupled to a second circuit board using a bendable conductive cable and wherein conductors of the second circuit board are coupled to the one or more conductors of the structure of the second motherboard.

An example includes one or more other examples, and includes an apparatus comprising: a connection structure comprising: a first circuit board with a conductive coupling to a second circuit board using a bendable insulator covered conductor; a third circuit board with a conductive coupling to a fourth circuit board using the bendable insulator covered conductor; and one or more clips, wherein conductors of the first circuit board oppose conductors of the third circuit board and conductors of the second circuit board oppose conductors of the fourth circuit board, a first motherboard is orthogonally arranged with a second motherboard using the connection structure, and conductors of the first motherboard are coupled to conductors of the second motherboard using the first, second, third, and fourth circuit boards.

Example 1 includes one or more examples and includes an apparatus comprising: a flexible conductor covered in an insulative material and at least one conductor region in contact with the flexible conductor, wherein melting of the at least one conductor region is to cause a conductive coupling of the flexible conductor with a second conductor and wherein the flexible conductor is adapted to conductively couple a first circuit board oriented orthogonal to a second circuit board.

Example 2 includes one or more examples, wherein the at least one conductor region comprises at least one solder ball of a grid array.

Example 3 includes one or more examples, wherein the at least one conductor region is re-solderable.

Example 4 includes one or more examples, and includes a circuit board comprising a conductor trace coupled to the at least one conductor region and a current source coupled to the conductor trace to provide a current to the at least one conductor region to heat the at least one conductor region.

Example 5 includes one or more examples, wherein the current source is to provide current to heat the at least one conductor region in connection with forming of a bond between the flexible conductor and the second conductor.

Example 6 includes one or more examples, wherein the current source is to provide current to heat the at least one conductor region in connection with breaking a bond between the flexible conductor and the second conductor.

Example 7 includes one or more examples, wherein the current source comprises a Pulse Width Modulation power controller.

Example 8 includes one or more examples, and includes a molding cover to guide the flexible conductor to contact the second conductor.

Example 9 includes one or more examples, and includes the first circuit board, wherein the first circuit board comprises one or more mounted devices capable of signal receipt or transmission using the flexible conductor, wherein the one or more mounted devices comprise one or more of: a central processing unit (CPU), graphics processing unit (GPU), general purpose GPU (GPGPU), accelerator, network interface, switch, memory, storage, or persistent memory.

Example 10 includes one or more examples, and includes the second circuit board, wherein the second circuit board comprises one or more mounted devices capable of signal receipt or transmission using the flexible conductor, wherein the one or more mounted devices comprise one or more of: a central processing unit (CPU), graphics processing unit (GPU), general purpose GPU (GPGPU), accelerator, network interface, switch, memory, storage, or persistent memory.

Example 11 includes one or more examples, and includes: the first circuit board, the second circuit board, and a container that contains fluid to provide two phase immersion liquid cooling (2PILC) for the first circuit board and the second circuit board.

Example 12 includes one or more examples, and includes a method comprising: forming an orthogonal connector system by: providing a molding cover; providing a flexible conductor; providing a printed circuit board comprising an upper conductor and lower conductor, wherein the upper conductor is conductively coupled to the lower conductor and the flexible conductor; and providing a solder region conductively coupled to the lower conductor and capable of forming a bond between the lower conductor and a conductor of a circuit board.

Example 13 includes one or more examples, wherein the flexible conductor comprises an insulator coating formed over metal-based traces.

Example 14 includes one or more examples, and includes providing a current source capable to provide a current to the solder region to heat the solder region and melt the solder region to form a bond between the conductor of the circuit board and the lower conductor.

Example 15 includes one or more examples, wherein the current source is capable to provide a current to the solder region to heat the solder region and melt the solder region in connection with breaking a bond between the conductor of the circuit board and the lower conductor.

Example 16 includes one or more examples, wherein the circuit board comprises one or more mounted devices thereto and wherein the one or more mounted devices comprise one or more of: a central processing unit (CPU), graphics processing unit (GPU), general purpose GPU (GPGPU), accelerator, network interface, switch, memory, storage, or persistent memory.

Example 17 includes one or more examples, and includes an apparatus comprising: a first circuit board comprising a recess region and a structure with one or more conductors and a second circuit board comprising a recess region and a second structure with one or more conductors, wherein: when the recess region of the first circuit board is inserted into the recess region of the second circuit board, the one or more conductors of the structure align with the one or more conductors of the second structure, an edge of the first circuit board is arranged approximately orthogonal with an edge of the second circuit board, and application of at least one current is to cause one or more solder regions to melt and form one or more bonds between the one or more conductors of the structure with the one or more conductors of the second structure.

Example 18 includes one or more examples, and includes a current source to provide the at least one current to cause the one or more solder regions to melt and form one or more bonds between the one or more conductors of the structure and the one or more conductors of the second structure.

Example 19 includes one or more examples, wherein the one or more conductors of the first circuit board are coupled to the one or more conductors of the second circuit board by a coupling circuitry comprising a flexible cable and at least two circuit boards.

Example 20 includes one or more examples, and includes an apparatus that includes an integer M number of circuit boards, wherein at least one of the M number of circuit boards comprises at least one conductor region and an integer N number of circuit boards, wherein at least one of the N number of circuit boards comprises at least one conductor region and wherein: edges of the M number of circuit boards are arranged orthogonal to edges of the N number of circuit boards, the at least one conductor region of the M number of circuit boards is coupled to the at least one conductor region of the N number of circuit boards by a device, and the device comprises at least one solder region whereby melting of the at least one solder region is to cause a conductive coupling between the at least one conductor region of the M number of circuit boards and the at least one conductor region of the N number of circuit boards.

Example 21 includes one or more examples, and includes at least one flexible conductor covered in an insulative material, wherein the at least one flexible conductor is in contact with the at least one solder region and wherein based on melting of the at least one solder region, the at least one flexible conductor is to provide the conductive coupling between the at least one conductor region of the M number of circuit boards and the at least one conductor region of the N number of circuit boards.

Example 22 includes one or more examples, wherein at least one of the M number of circuit boards comprises one or more devices mounted thereto and wherein the one or more mounted devices comprise one or more of: a central processing unit (CPU), graphics processing unit (GPU), general purpose GPU (GPGPU), accelerator, network interface, switch, memory, storage, or persistent memory and at least one of the N number of circuit boards comprises one or more devices mounted thereto and wherein the one or more mounted devices comprise one or more of: a central processing unit (CPU), graphics processing unit (GPU), general purpose GPU (GPGPU), accelerator, network interface, switch, memory, storage, or persistent memory.

The invention claimed is:
1. An apparatus comprising:
 a first circuit board comprising at least one conductor region;
 a second circuit board; and
 a coupling circuitry covered in an insulative material, wherein:
the coupling circuitry comprises a flexible cable, a third circuit board, and a fourth circuit board,
melting of the at least one conductor region is to cause a conductive coupling of the at least one conductor region with the third circuit board,
the coupling circuitry is adapted to conductively couple the first circuit board oriented orthogonal to the second circuit board, and
the third circuit board and the fourth circuit board are oriented perpendicular.

2. The apparatus of claim 1, wherein the at least one conductor region comprises at least one solder ball of a grid array.

3. The apparatus of claim 1, wherein the at least one conductor region is re-solderable.

4. The apparatus of claim 1, comprising:
a conductor trace coupled to the at least one conductor region and
a current source coupled to the conductor trace to provide a current to the at least one conductor region to heat the at least one conductor region.

5. The apparatus of claim 4, wherein the current source is to provide a current to heat the at least one conductor region in connection with forming of a bond between the coupling circuitry and the at least one conductor region.

6. The apparatus of claim 4, wherein the current source is to provide current to heat the at least one conductor region in connection with breaking a bond between the coupling circuitry and the at least one conductor region.

7. The apparatus of claim 4, wherein the current source comprises a Pulse Width Modulation power controller.

8. The apparatus of claim 1, comprising a molding cover to guide the coupling circuitry to contact the at least one conductor region.

9. The apparatus of claim 1, wherein the first circuit board comprises one or more mounted devices capable of signal receipt or transmission using the coupling circuitry, wherein the one or more mounted devices comprise one or more of: a central processing unit (CPU), graphics processing unit (GPU), general purpose GPU (GPGPU), accelerator, network interface, switch, memory, storage, or persistent memory.

10. The apparatus of claim 1, wherein the second circuit board comprises one or more mounted devices capable of signal receipt or transmission using the coupling circuitry, wherein the one or more mounted devices comprise one or more of: a central processing unit (CPU), graphics processing unit (GPU), general purpose GPU (GPGPU), accelerator, network interface, switch, memory, storage, or persistent memory.

11. The apparatus of claim 1, comprising:
a container that contains fluid to provide two phase immersion liquid cooling (2PILC) for at least the first circuit board and the second circuit board.

12. An apparatus comprising:
a first circuit board comprising a recess region and a first structure comprising one or more conductors;
a second circuit board comprising a recess region and a second structure with comprising one or more conductors; and
a coupling circuitry comprising a flexible cable, a third circuit board, and a fourth circuit board, wherein:
when the recess region of the first circuit board is inserted into the recess region of the second circuit board, the one or more conductors of the first structure align with the one or more conductors of the second structure,
an edge of the first circuit board is arranged orthogonal with an edge of the second circuit board,
application of at least one current is to cause one or more bonds between the one or more conductors of the first structure with the one or more conductors of the second structure,
the one or more conductors of the first structure are coupled to the one or more conductors of the second structure by the coupling circuitry,
melting of the one or more conductors of the first structure is to cause a soldering of the one or more conductors of the first structure to the third circuit board, and
the third circuit board and the fourth circuit board are oriented perpendicular.

13. The apparatus of claim 12, comprising:
a current source to provide the at least one current to cause the one or more conductors of the first structure to melt and form the one or more bonds between the one or more conductors of the first structure and the one or more conductors of the second structure.

14. An apparatus comprising:
an integer M number of circuit boards, wherein at least one of the M number of circuit boards comprises at least one conductor region; and
an integer N number of circuit boards, wherein at least one of the N number of circuit boards comprises at least one conductor region, wherein
edges of the M number of circuit boards are arranged orthogonal to edges of the N number of circuit boards,
the at least one conductor region of the M number of circuit boards is coupled to the at least one conductor region of the N number of circuit boards by a device,
the device comprises at least one solder region whereby melting of the at least one solder region is to cause a conductive coupling between the at least one conductor region of the M number of circuit boards and the at least one conductor region of the N number of circuit boards,
the device comprises at least one flexible conductor covered in an insulative material, a first circuit board, and a second circuit board,
melting of the at least one solder region is to cause a soldering of the at least one conductor region of the M number of circuit boards to the first circuit board, and
the first circuit board and the second circuit board are oriented perpendicular.

15. The apparatus of claim 14, wherein
at least one of the M number of circuit boards comprises one or more devices mounted thereto and wherein the one or more mounted devices of the M number of circuit boards comprise one or more of: a central processing unit (CPU), graphics processing unit (GPU), general purpose GPU (GPGPU), accelerator, network interface, switch, memory, storage, or persistent memory and
at least one of the N number of circuit boards comprises one or more devices mounted thereto and wherein the one or more mounted devices of the N number of circuit boards comprise one or more of: a CPU, GPU, GPGPU, accelerator, network interface, switch, memory, storage, or persistent memory.

16. A method comprising:
forming an orthogonal connector system by:
- inserting a recessed region of a first circuit board into a recessed region of a second circuit board;
- aligning one or more conductors of the first circuit board with the one or more conductors of the second circuit board;
- coupling a flexible conductor to the one or more conductors of the first circuit board and the one or more conductors of the second circuit board, wherein the flexible conductor comprises a flexible cable, a third circuit board, and a fourth circuit board;
- soldering the one or more conductors of the first circuit board to the third circuit board; and
- soldering the one or more conductors of the second circuit board to the fourth circuit board, wherein the third and fourth circuit boards are oriented perpendicular.

17. The method of claim 16, wherein the flexible conductor comprises an insulator coating formed over metal-based traces.

18. The method of claim 16, comprising:
a current source providing a current to solder the one or more conductors of the first circuit board to the third circuit board.

19. The method of claim 16, comprising:
a current source providing a current to break a bond between the one or more conductors of the first circuit board to the third circuit board.

20. The method of claim 16, wherein:
the first circuit board comprises one or more devices mounted thereto and wherein the one or more mounted devices of the first circuit board comprise one or more of: a central processing unit (CPU), graphics processing unit (GPU), general purpose GPU (GPGPU), accelerator, network interface, switch, memory, storage, or persistent memory and
the second circuit board comprises one or more devices mounted thereto and wherein the one or more mounted devices of the second circuit board comprise one or more of: a CPU, GPU, GPGPU, accelerator, network interface, switch, memory, storage, or persistent memory.

* * * * *